US008674104B2

(12) United States Patent
Koenemann et al.

(10) Patent No.: US 8,674,104 B2
(45) Date of Patent: Mar. 18, 2014

(54) HALOGEN-CONTAINING PERYLENETETRACARBOXYLIC ACID DERIVATIVES AND THE USE THEREOF

(71) Applicant: BASF SE, Ludwigshafen (DE)

(72) Inventors: Martin Koenemann, Mannheim (DE); Gabriele Mattern, Schifferstadt (DE); Gerd Weber, Bad Duerkheim (DE)

(73) Assignee: BASF SE, Ludwigshafen (DE)

( * ) Notice: Subject to any disclaimer, the term of this patent is extended or adjusted under 35 U.S.C. 154(b) by 0 days.

(21) Appl. No.: 13/734,460

(22) Filed: Jan. 4, 2013

(65) Prior Publication Data
US 2013/0123495 A1 May 16, 2013

Related U.S. Application Data

(62) Division of application No. 12/673,908, filed on Feb. 17, 2010, now abandoned, which is a division of application No. PCT/EP2008/060633, filed on Aug. 13, 2008.

(30) Foreign Application Priority Data

Aug. 17, 2007 (EP) ..................... 07114556

(51) Int. Cl.
C07D 221/18 (2006.01)
C07D 221/22 (2006.01)
C07D 471/00 (2006.01)
C07D 491/00 (2006.01)
C07D 498/00 (2006.01)
C07D 513/00 (2006.01)
C07D 515/00 (2006.01)

(52) U.S. Cl.
USPC ............................................. 546/37; 546/26

(58) Field of Classification Search
None
See application file for complete search history.

(56) References Cited

U.S. PATENT DOCUMENTS

| | | | |
|---|---|---|---|
| 5,736,596 | A | 4/1998 | Heitz et al. |
| 2007/0259475 | A1 | 11/2007 | Konemann et al. |
| 2008/0009092 | A1 | 1/2008 | Koenemann et al. |
| 2008/0017850 | A1 | 1/2008 | Koenemann et al. |
| 2008/0035914 | A1 | 2/2008 | Konemann et al. |
| 2008/0054258 | A1 | 3/2008 | Koenemann et al. |
| 2008/0087878 | A1 | 4/2008 | Koenemann et al. |
| 2008/0090325 | A1 | 4/2008 | Koenemann et al. |
| 2008/0245411 | A1 | 10/2008 | Hammermann et al. |
| 2008/0269482 | A1 | 10/2008 | Pschirer et al. |
| 2008/0300405 | A1 | 12/2008 | Koenemann |
| 2009/0166614 | A1 | 7/2009 | Koenemann et al. |
| 2009/0189086 | A1 | 7/2009 | Gessner et al. |
| 2009/0236591 | A1 | 9/2009 | Koenemann et al. |
| 2010/0011656 | A1 | 1/2010 | Gessner et al. |
| 2011/0068328 | A1* | 3/2011 | Koenemann et al. ........... 257/40 |

FOREIGN PATENT DOCUMENTS

| | | |
|---|---|---|
| DE | 4327273 | 2/1995 |
| EP | 0 698 649 | 2/1996 |
| JP | 58-111886 | 7/1983 |
| JP | 60-122954 | 7/1985 |
| JP | 02-189890 | 7/1990 |
| JP | 2008-176542 | 7/2008 |
| JP | 2011-124382 | 6/2011 |
| WO | 2005 076815 | 8/2005 |
| WO | 2007/066898 | 6/2007 |
| WO | 2007 093643 | 8/2007 |
| WO | 2008 113753 | 9/2008 |
| WO | 2009 000831 | 12/2008 |
| WO | WO 2009/024512 A1 * | 2/2009 |

OTHER PUBLICATIONS

Sadrai, M. et al. A Charge Transfer Complex. Acta Cryst. 1990, vol. C46, p. 637, introduction, lines 1-5.*
Sadri, M et al. A Charge Transfer Complex. Acta Cryst. 1990, vol. C46, p. 637, introduction, lines 1-5.*
Sadrai, M. et al. "A Charge-Transfer Complex of Benzene With a Highly Twisted Perylene Derivative", Acta Cryst, vol. C46, pp. 637-640 (1990) XP002501244.
Chen, Z. et al., "Tetrachloro-Substituted Perylene Bisimide Dyes As Promising n-Type Organic Semiconductors: Studies on Structural, Electrochemical and Charge Transport Properties", Chem. Phys. Chem, vol. 5, pp. 137-140 (2004) XP002501245.
Dorwald F. A. Side Reactions in Orgainc Synthesis, 2005, Wiley: VCH, Weinheim p. IX of Preface p. 1-15.
Mahin Sadrai et al., "Lasting Action in a Family of Perylene Derivatives", The Journal of Physical Chemistry, vol. 96, No. 20, Oct. 1, 1992, pp. 7988-7996.

* cited by examiner

Primary Examiner — Rita Desai
Assistant Examiner — Ben S Michelson
(74) Attorney, Agent, or Firm — Oblon, Spivak, McClelland, Maier & Neustadt, L.L.P.

(57) ABSTRACT

The invention relates to compounds of the formula (I)

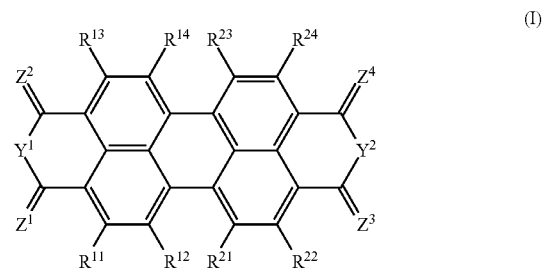

(I)

in which $Y^1$ and $Y^2$ are each O or, respectively, $NR^a$ or $NR^b$, where $R^a$ and $R^b$ are each H or organyl; $Z^1$ to $Z^4$ are each O or S; $R^{11}$ to $R^{14}$, $R^{21}$ to $R^{24}$ are each Cl, F; where 1 or 2 of the $R^{11}$ to $R^{14}$, $R^{21}$ to $R^{24}$ radicals may also be CN and/or 1 $R^{11}$ to $R^{14}$, $R^{21}$ to $R^{24}$ radical may be H; and where, when $Y^1$ is $NR^a$, $Z^1$ or $Z^2$ may also be $NR^c$, where $R^a$ and $R^c$ together are a bridging X group having from 2 to 5 atoms; and where, when $Y^2$ is $NR^b$, $Z^3$ or $Z^4$ may also be $NR^d$, where $R^b$ and $R^d$ together are a bridging X group having from 2 to 5 atoms; to a process for preparation thereof, and to their use as emitter materials, charge transport materials or exciton transport materials.

9 Claims, No Drawings

HALOGEN-CONTAINING PERYLENETETRACARBOXYLIC ACID DERIVATIVES AND THE USE THEREOF

CROSS REFERENCE TO RELATED APPLICATIONS

This application is a divisional of U.S. application Ser. No. 12/673,908, filed on Feb. 17, 2010, which is a 371 of PCT/EP08/060,633, filed on Aug. 13, 2008, and claims priority to European Patent Application No. 07114556.9, filed on Aug. 17, 2007.

The present invention relates to highly halogenated, especially chlorinated and/or fluorinated, especially perhalogenated, perylenetetracarboxylic acid derivatives and to their use as emitter materials, charge transport materials or exciton transport materials.

It is expected that, in the future, not only the classical inorganic semiconductors but increasingly also organic semiconductors based on low molecular weight or polymeric materials will be used in many sectors of the electronics industry. In many cases, these organic semiconductors have advantages over the classical inorganic semiconductors, for example better substrate compatibility and better processability of the semiconductor components based on them. They allow processing on flexible substrates and enable their interface orbital energies to be adjusted precisely to the particular application sector by the methods of molecular modeling. The significantly reduced costs of such components have brought a renaissance to the field of research of organic electronics. "Organic electronics" is concerned principally with the development of new materials and manufacturing processes for the production of electronic components based on organic semiconductor layers. These include in particular organic field-effect transistors (OFETs) and organic light-emitting diodes (OLEDs), and photovoltaics. Great potential for development is ascribed to organic field-effect transistors, for example in memory elements and integrated optoelectronic devices. Organic light-emitting diodes (OLEDs) exploit the property of materials of emitting light when they are excited by electrical current. OLEDs are particularly of interest as alternatives to cathode ray tubes and liquid-crystal displays for producing flat visual display units. Owing to the very compact design and the intrinsically lower power consumption, devices which comprise OLEDs are suitable especially for mobile applications, for example for applications in cellphones, laptops, etc. Great potential for development is also ascribed to materials which have maximum transport widths and high mobilities for light-induced excited states (high exciton diffusion lengths) and which are thus advantageously suitable for use as an active material in so-called excitonic solar cells. It is generally possible with solar cells based on such materials to achieve very good quantum yields.

There is therefore a great need for organic compounds which are suitable as emitter materials, charge transport materials or exciton transport materials.

PCT/EP 2007/051532 (WO 2007/093643), unpublished at the priority date of this application, describes the use of compounds of the general formula (B)

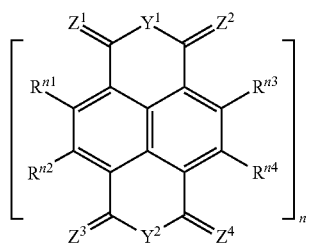

(B)

where
n is 2, 3 or 4,
at least one of the $R^{n1}$, $R^{n2}$, $R^{n3}$ and $R^{n4}$ radicals is fluorine, optionally at least one further $R^{n1}$, $R^{n2}$, $R^{n3}$ and $R^{n4}$ radical is a substituent which is selected independently from Cl and Br, and the remaining radicals are each hydrogen,
$Y^1$ is O or $NR^a$ where $R^a$ is hydrogen or an organyl radical,
$Y^2$ is O or $NR^b$ where $R^b$ is hydrogen or an organyl radical,
$Z^1$, $Z^2$, $Z^3$ and $Z^4$ are each O,
where, in the case that $Y^1$ is $NR^a$, one of the $Z^1$ and $Z^2$ radicals may also be NRC, where the $R^a$ and $R^c$ radicals together are a bridging group having from 2 to 5 atoms between the flanking bonds, and
where, in the case that $Y^2$ is $NR^b$, one of the $Z^3$ and $Z^4$ radicals may also be $NR^d$, where the $R^b$ and $R^d$ radicals together are a bridging group having from 2 to 5 atoms between the flanking bonds,
as semiconductors, especially n-semiconductors, in organic electronics, especially for organic field-effect transistors, solar cells and organic light-emitting diodes.

H. J. Schugar (Acta Cryst. (1990), C46, 637-640) describes N,N'-dimethyloctachloro-perylene-3,4:9,10-tetracarboximide, the potential use of this compound in solar cells and the preparation of this compound by chlorinating N,N'-dimethylperylene-3,4:9,10-tetracarboximide.

It has now been found that, surprisingly, highly halogenated perylenetetracarboxylic acid derivatives of the formula (I) described below are particularly advantageously suitable as emitter materials, charge transport materials or exciton transport materials. They are notable especially as air-stable n-semiconductors with exceptionally high charge mobilities. Moreover, they have advantageous properties for use in excitonic solar cells.

The present invention therefore relates firstly to compounds of the general formula (I)

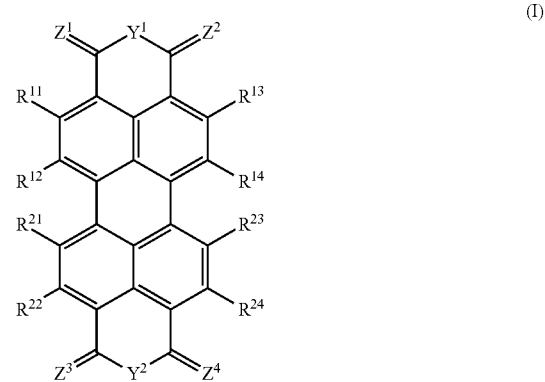

(I)

in which
$Y^1$ is O or $NR^a$ where $R^a$ is hydrogen or an organyl radical,
$Y^2$ is O or $NR^b$ where $R^b$ is hydrogen or an organyl radical,
$Z^1$, $Z^2$, $Z^3$ and $Z^4$ are each O or S and
the $R^{11}$, $R^{12}$, $R^{13}$, $R^{14}$, $R^{21}$, $R^{22}$, $R^{23}$ and $R^{24}$ radicals are each chlorine and/or fluorine,
where 1 or 2 of the $R^{11}$, $R^{12}$, $R^{13}$, $R^{14}$, $R^{21}$, $R^{22}$, $R^{23}$ and $R^{24}$ radicals may also be CN and/or 1 $R^{11}$, $R^{12}$, $R^{13}$, $R^{14}$, $R^{21}$, $R^{22}$, $R^{23}$ and $R^{24}$ radical may be hydrogen, and
where, in the case that $Y^1$ is $NR^a$, one of the $Z^1$ and $Z^2$ radicals may also be $NR^c$, where the $R^a$ and $R^c$ radicals together are a bridging X group having from 2 to 5 atoms between the flanking bonds, and where, in the case that $Y^2$ is $NR^b$, one of the $Z^3$ and $Z^4$ radicals may also be $NR^d$, where the $R^b$ and $R^d$ radicals together are a bridging X group having from 2 to 5 atoms between the flanking bonds.

Excluded from the aforementioned compounds of the general formula (I) are the aforementioned octachloro-N,N'-dimethylperylimide and the heptachloro-N,N'-dimethyl-chloroperylimides obtainable as by-products in its preparation. The restrictions made above also apply with regard to the use and preparation of the compounds of the formula (I) where this is anticipated by the aforementioned documents.

The invention therefore further relates to the use of the compounds of the formula (I) as emitter materials, charge transport materials or exciton transport materials.

In the context of the present invention, the expression "alkyl" comprises straight-chain or branched alkyl. It is preferably straight-chain or branched $C_1$-$C_{30}$-alkyl, especially $C_1$-$C_{20}$-alkyl and most preferably $C_1$-$C_{12}$-alkyl. Examples of alkyl groups are especially methyl, ethyl, n-propyl, isopropyl, n-butyl, isobutyl, sec-butyl, tert-butyl, n-pentyl, n-hexyl, n-heptyl, n-octyl, n-nonyl, n-decyl, n-undecyl, n-dodecyl, n-tridecyl, n-tetradecyl, n-hexadecyl, n-octadecyl and n-eicosyl.

The expression alkyl also comprises alkyl radicals whose carbon chains may be interrupted by one or more nonadjacent groups which are selected from —O—, —S—, —$NR^f$—, —C(=O)—, —S(=O)— and/or —S(=O)$_2$—. $R^f$ is preferably hydrogen, alkyl, cycloalkyl, heterocycloalkyl, aryl or hetaryl. The expression alkyl also comprises substituted alkyl radicals. Substituted alkyl groups may, depending on the length of the alkyl chain, have one or more (e.g. 1, 2, 3, 4, 5 or more than 5) substituents. These are preferably each independently selected from cycloalkyl, heterocycloalkyl, aryl, hetaryl, halogen, hydroxyl, mercapto, COOH, carboxylate, $SO_3H$, sulfonate, $NE^1E^2$, nitro and cyano, where $E^1$ and $E^2$ are each independently hydrogen, alkyl, cycloalkyl, heterocycloalkyl, aryl or hetaryl. Halogen substituents are preferably fluorine, chlorine or bromine.

Carboxylate and sulfonate are, respectively, a derivative of a carboxylic acid function or a sulfonic acid function, especially a metal carboxylate or sulfonate, a carboxylic ester or sulfonic ester function or a carboxamide or sulfonamide function. Cycloalkyl, heterocycloalkyl, aryl and hetaryl substituents of the alkyl groups may in turn be unsubstituted or substituted; suitable substituents are those specified below for these groups.

The above remarks regarding alkyl also apply to the alkyl moieties in alkoxy, alkyl-amino, alkylthio, alkylsulfynyl, alkylsulfonyl, etc.

Aryl-substituted alkyl radicals ("arylalkyl") have at least one unsubstituted or substituted aryl group as defined below. The alkyl group in "arylalkyl" may bear at least one further substituent and/or be interrupted by one or more nonadjacent groups which are selected from —O—, —S—, —$NR^f$—, —CO— and/or —$SO_2$—. $R^f$ is as defined above. Arylalkyl is preferably phenyl-$C_1$-$C_{10}$-alkyl, more preferably phenyl-$C_1$-$C_4$-alkyl, for example benzyl, 1-phenethyl, 2-phenethyl, 1-phenprop-1-yl, 2-phenprop-1-yl, 3-phenprop-1-yl, 1-phenbut-1-yl, 2-phenbut-1-yl, 3-phenbut-1-yl, 4-phenbut-1-yl, 1-phenbut-2-yl, 2-phenbut-2-yl, 3-phenbut-2-yl, 4-phenbut-2-yl, 1-(phenmeth)eth-1-yl, 1-(phenmethyl)-1-(methyl)eth-1-yl or (phenmethyl)-1-(methyl)prop-1-yl; preferably benzyl and 2-phenethyl.

In the context of the present invention, the expression "alkenyl" comprises straight-chain and branched alkenyl groups which, depending on the chain length, may bear one or more double bonds (e.g. 1, 2, 3, 4 or more than 4). Preference is given to $C_2$-$C_{18}$—, particular preference to $C_2$-$C_{12}$-alkenyl groups. Straight-chain or branched alkenyl groups having two double bonds are also referred to hereinafter as alkadienyl. The expression "alkenyl" also comprises substituted alkenyl groups which may bear one or more (e.g. 1, 2, 3, 4, 5 or more than 5) substituents. Suitable substituents are, for example, selected from cycloalkyl, heterocycloalkyl, aryl, hetaryl, halogen, hydroxyl, mercapto, COOH, carboxylate, $SO_3H$, sulfonate, $NE^3E^4$, nitro and cyano, where $E^3$ and $E^4$ are each independently hydrogen, alkyl, cycloalkyl, heterocycloalkyl, aryl or hetaryl.

Alkenyl is then, for example, ethenyl, 1-propenyl, 2-propenyl, 1-butenyl, 2-butenyl, 3-butenyl, 1-pentenyl, 2-pentenyl, 3-pentenyl, 4-pentenyl, 1-hexenyl, 2-hexenyl, 3-hexenyl, 4-hexenyl, 5-hexenyl, penta-1,3-dien-1-yl, hexa-1,4-dien-1-yl, hexa-1,4-dien-3-yl, hexa-1,4-dien-6-yl, hexa-1,5-dien-1-yl, hexa-1,5-dien-3-yl, hexa-1,5-dien-4-yl, hepta-1,4-dien-1-yl, hepta-1,4-dien-3-yl, hepta-1,4-dien-6-yl, hepta-1,4-dien-7-yl, hepta-1,5-dien-1-yl, hepta-1,5-dien-3-yl, hepta-1,5-dien-4-yl, hepta-1,5-dien-7-yl, hepta-1,6-dien-1-yl, hepta-1,6-dien-3-yl, hepta-1,6-dien-4-yl, hepta-1,6-dien-5-yl, hepta-1,6-dien-2-yl, octa-1,4-dien-1-yl, octa-1,4-dien-2-yl, octa-1,4-dien-3-yl, octa-1,4-dien-6-yl, octa-1,4-dien-7-yl, octa-1,5-dien-1-yl, octa-1,5-dien-3-yl, octa-1,5-dien-4-yl, octa-1,5-dien-7-yl, octa-1,6-dien-1-yl, octa-1,6-dien-3-yl, octa-1,6-dien-4-yl, octa-1,6-dien-5-yl, octa-1,6-dien-2-yl, deca-1,4-dienyl, deca-1,5-dienyl, deca-1,6-dienyl, deca-1,7-dienyl, deca-1,8-dienyl, deca-2,5-dienyl, deca-2,6-dienyl, deca-2,7-dienyl, deca-2,8-dienyl and the like. The remarks regarding alkenyl also apply to the alkenyl groups in alkenyloxy, alkenylthio, etc.

The expression "alkynyl" comprises unsubstituted or substituted alkynyl groups which have one or more nonadjacent triple bonds, such as ethynyl, 1-propynyl, 2-propynyl, 1-butynyl, 2-butynyl, 3-butynyl, 1-pentynyl, 2-pentynyl, 3-pentynyl, 4-pentynyl, 1-hexynyl, 2-hexynyl, 3-hexynyl, 4-hexynyl, 5-hexynyl, and the like. The remarks regarding alkynyl also apply to the alkynyl groups in alkynyloxy, alkynylthio, etc. Substituted alkynyls preferably bear one or more (e.g. 1, 2, 3, 4, 5 or more than 5) of the substituents specified above for alkyl.

In the context of the present invention, the expression "cycloalkyl" comprises unsubstituted or else substituted cycloalkyl groups, preferably $C_3$-$C_8$-cycloalkyl groups such as cyclopropyl, cyclobutyl, cyclopentyl, cyclohexyl, cycloheptyl or cyclooctyl, especially $C_5$-$C_8$-cycloalkyl. Substituted cycloalkyl groups may have one or more (e.g. 1, 2, 3, 4, 5 or more than 5) substituents. These are preferably each independently selected from alkyl and the substituents specified above for the alkyl groups. In the case of substitution, the cycloalkyl groups preferably bear one or more, for example one, two, three, four or five, $C_1$-$C_6$-alkyl groups.

Examples of preferred cycloalkyl groups are cyclopentyl, 2- and 3-methylcyclopentyl, 2- and 3-ethylcyclopentyl, cyclohexyl, 2-, 3- and 4-methylcyclohexyl, 2-, 3- and 4-ethylcyclohexyl, 3- and 4-propylcyclohexyl, 3- and 4-isopropylcyclohexyl, 3- and 4-butylcyclohexyl, 3- and 4-sec-butylcyclohexyl, 3- and 4-tert-butylcyclohexyl, cycloheptyl, 2-, 3- and 4-methylcycloheptyl, 2-, 3- and 4-ethylcycloheptyl, 3- and 4-propylcycloheptyl, 3- and 4-isopropylcycloheptyl, 3- and 4-butylcycloheptyl, 3- and 4-sec-butylcycloheptyl, 3- and 4-tert-butylcycloheptyl, cyclooctyl, 2-, 3-, 4- and 5-methylcyclooctyl, 2-, 3-, 4- and 5-ethylcyclooctyl, 3-, 4- and 5-propylcyclooctyl.

The expression cycloalkenyl comprises unsubstituted and substituted monounsaturated hydrocarbon groups having from 3 to 8, preferably from 5 to 6 carbon ring members, such as cyclopenten-1-yl, cyclopenten-3-yl, cyclohexen-1-yl, cyclohexen-3-yl, cyclohexen-4-yl and the like. Suitable substituents are those specified above for cycloalkyl.

The expression bicycloalkyl preferably comprises bicyclic hydrocarbon radicals having from 5 to 10 carbon atoms, such as bicyclo[2.2.1]hept-1-yl, bicyclo[2.2.1]hept-2-yl, bicyclo[2.2.1]hept-7-yl, bicyclo[2.2.2]oct-1-yl, bicyclo[2.2.2]oct-2-yl, bicyclo[3.3.0]octyl, bicyclo[4.4.0]decyl and the like.

In the context of the present invention, the expression "aryl" comprises mono- or polycyclic aromatic hydrocarbon radicals which may be unsubstituted or substituted. Aryl is preferably unsubstituted or substituted phenyl, naphthyl, indenyl, fluorenyl, anthracenyl, phenanthrenyl, naphthacenyl, chrysenyl, pyrenyl, etc., and more preferably phenyl or naphthyl. Substituted aryls may, depending on the number and size of their ring systems, have one or more (e.g. 1, 2, 3, 4, 5 or more than 5) substituents. They are preferably each independently selected from alkyl, alkoxy, cycloalkyl, heterocycloalkyl, aryl, hetaryl, halogen, hydroxyl, mercapto, COOH, carbon/late, $SO_3H$, sulfonate, $NE^5E^6$, nitro and cyano, where $E^5$ and $E^6$ are each independently hydrogen, alkyl, cycloalkyl, heterocycloalkyl, aryl or hetaryl. Halogen substituents are preferably fluorine, chlorine or bromine. Aryl is more preferably phenyl which, in the case of substitution, may bear generally 1, 2, 3, 4 or 5, preferably 1, 2 or 3 substituents. These are preferably each independently selected from alkyl and the substituents mentioned above for the alkyl groups.

Aryl which bears one or more radicals is, for example, 2-, 3- and 4-methylphenyl, 2,4-, 2,5-, 3,5- and 2,6-dimethylphenyl, 2,4,6-trimethylphenyl, 2-, 3- and 4-ethyl-phenyl, 2,4-, 2,5-, 3,5- and 2,6-diethylphenyl, 2,4,6-triethylphenyl, 2-, 3- and 4-propyl-phenyl, 2,4-, 2,5-, 3,5- and 2,6-dipropylphenyl, 2,4,6-tripropylphenyl, 2-, 3- and 4-isopropylphenyl, 2,4-, 2,5-, 3,5- and 2,6-diisopropylphenyl, 2,4,6-triisopropylphenyl, 2-, 3- and 4-butylphenyl, 2,4-, 2,5-, 3,5- and 2,6-dibutylphenyl, 2,4,6-tributylphenyl, 2-, 3- and 4-isobutylphenyl, 2,4-, 2,5-, 3,5- and 2,6-diisobutylphenyl, 2,4,6-triisobutylphenyl, 2-, 3- and 4-sec-butylphenyl, 2,4-, 2,5-, 3,5- and 2,6-di-sec-butylphenyl, 2,4,6-tri-sec-butylphenyl, 2-, 3- and 4-tert-butylphenyl, 2,4-, 2,5-, 3,5- and 2,6-di-tert-butylphenyl and 2,4,6-tri-tert-butylphenyl; 2-, 3- and 4-methoxyphenyl, 2,4-, 2,5-, 3,5- and 2,6-dimethoxyphenyl, 2,4,6-trimethoxyphenyl, 2-, 3- and 4-ethoxyphenyl, 2,4-, 2,5-, 3,5- and 2,6-diethoxyphenyl, 2,4,6-triethoxyphenyl, 2-, 3- and 4-propoxyphenyl, 2,4-, 2,5-, 3,5- and 2,6-dipropoxyphenyl, 2-, 3- and 4-isopropoxyphenyl, 2,4-, 2,5-, 3,5- and 2,6-diisopropoxyphenyl and 2-, 3- and 4-butoxyphenyl; 2-, 3- and 4-cyanophenyl.

In the context of the present invention, the expression "heterocycloalkyl" comprises nonaromatic, unsaturated or fully saturated, cycloaliphatic groups having generally from 5 to 8 ring atoms, preferably 5 or 6 ring atoms, in which 1, 2 or 3 of the ring carbon atoms are replaced by heteroatoms selected from oxygen, nitrogen, sulfur and an $—NR^f—$ group and which is unsubstituted or substituted by one or more, for example 1, 2, 3, 4, 5 or 6 $C_1$-$C_6$-alkyl groups. $R^f$ is preferably hydrogen, alkyl, cycloalkyl, heterocycloalkyl, aryl or hetaryl. Examples of such heterocycloaliphatic groups include pyrrolidinyl, piperidinyl, 2,2,6,6-tetramethylpiperidinyl, imidazolidinyl, pyrazolidinyl, oxazolidinyl, morpholidinyl, thiazolidinyl, isothiazolidinyl, isoxazolidinyl, piperazinyl, tetrahydrothiophenyl, dihydrothien-2-yl, tetrahydrofuranyl, dihydrofuran-2-yl, tetrahydropyranyl, 1,2-oxazolin-5-yl, 1,3-oxazolin-2-yl and dioxanyl.

In the context of the present invention, the expression "hetaryl" comprises unsubstituted or substituted, heteroaromatic, mono- or polycyclic groups, preferably the pyridyl, quinolinyl, acridinyl, pyridazinyl, pyrimidinyl, pyrazinyl, pyrrolyl, imidazolyl, pyrazolyl, indolyl, purinyl, indazolyl, benzotriazolyl, 1,2,3-triazolyl, 1,3,4-triazolyl and carbazolyl groups, where these heterocycloaromatic groups, in the case of substitution, may bear generally 1, 2 or 3 substituents. The substituents are preferably selected from $C_1$-$C_6$-alkyl, $C_1$-$C_6$-alkoxy, hydroxyl, carboxyl, halogen and cyano.

Nitrogen-containing 5-7-membered heterocycloalkyl or heteroaryl radicals which optionally comprise further heteroatoms selected from oxygen and sulfur comprise, for example, pyrrolyl, pyrazolyl, imidazolyl, triazolyl, pyrrolidinyl, pyrazolinyl, pyrazolidinyl, imidazolinyl, imidazolidinyl, pyridinyl, pyridazinyl, pyrimidinyl, pyrazinyl, triazinyl, piperidinyl, piperazinyl, oxazolyl, isooxazolyl, thiazolyl, isothiazolyl, indolyl, quinolinyl, isoquinolinyl or quinaldinyl.

Halogen is fluorine, chlorine, bromine or iodine.

Specific examples of the $R^a$ and $R^b$ radicals specified in the following formulae are as follows:

methyl, ethyl, n-propyl, isopropyl, n-butyl, isobutyl, sec-butyl, tert-butyl, n-pentyl, n-hexyl, n-heptyl, n-octyl, n-nonyl, n-decyl, n-undecyl, n-dodecyl, n-tridecyl, n-tetradecyl, n-hexadecyl, n-octadecyl and n-eicosyl, 2-methoxyethyl, 2-ethoxyethyl, 2-propoxyethyl, 2-butoxyethyl, 3-methoxypropyl, 3-ethoxypropyl, 3-propoxypropyl, 3-butoxypropyl, 4-methoxybutyl, 4-ethoxybutyl, 4-propoxybutyl, 3,6-dioxaheptyl, 3,6-dioxaoctyl, 4,8-dioxanonyl, 3,7-dioxaoctyl, 3,7-dioxanonyl, 4,7-dioxaoctyl, 4,7-dioxanonyl, 2- and 4-butoxybutyl, 4,8-dioxadecyl, 3,6,9-trioxadecyl, 3,6,9-trioxaundecyl, 3,6,9-trioxadodecyl, 3,6,9,12-tetraoxamidecyl and 3,6,9,12-tetraoxatetradecyl;

2-methylthioethyl, 2-ethylthioethyl, 2-propylthioethyl, 2-butylthioethyl, 3-methylthiopropyl, 3-ethylthiopropyl, 3-propylthiopropyl, 3-butylthiopropyl, 4-methylthiobutyl, 4-ethylthiobutyl, 4-propylthiobutyl, 3,6-dithiaheptyl, 3,6-dithiaoctyl, 4,8-dithianonyl, 3,7-dithiaoctyl, 3,7-dithianonyl, 2- and 4-butylthiobutyl, 4,8-dithiadecyl, 3,6,9-trithiadecyl, 3,6,9-trithiaundecyl, 3,6,9-trithiadodecyl, 3,6,9,12-tetrathiamidecyl and 3,6,9,12-tetrathiatetradecyl;

2-monomethyl- and 2-monoethylaminoethyl, 2-dimethylaminoethyl, 2- and 3-dimethylaminopropyl, 3-monoisopropylaminopropyl, 2- and 4-monopropylaminobutyl, 2- and 4-dimethylaminobutyl, 6-methyl-3,6-diazaheptyl, 3,6-dimethyl-3,6-diazaheptyl, 3,6-diazaoctyl, 3,6-dimethyl-3,6-diazaoctyl, 9-methyl-3,6,9-triazadecyl, 3,6,9-trimethyl-3,6,9-triazadecyl, 3,6,9-triazaundecyl, 3,6,9-trimethyl-3,6,9-triazaundecyl, 12-methyl-3,6,9,12-tetraazamidecyl and 3,6,9,12-tetramethyl-3,6,9,12-tetraazamidecyl;

(1-ethylethylidene)aminoethylene, (1-ethylethylidene)aminopropylene, (1-ethylethylidene)aminobutylene, (1-ethylethylidene)aminodecylene and (1-ethylethylidene)aminododecylene;

propan-2-on-1-yl, butan-3-on-1-yl, butan-3-on-2-yl and 2-ethylpentan-3-on-1-yl;

2-methylsulfinylethyl, 2-ethylsulfinylethyl, 2-propylsulfinylethyl, 2-isopropylsulfinylethyl, 2-butylsulfinylethyl, 2- and 3-methylsulfinylpropyl, 2- and 3-ethylsulfinypropyl, 2- and 3-propylsulfinylpropyl, 2- and 3-butylsulfinylpropyl, 2- and 4-methylsulfinylbutyl, 2- and 4-ethylsulfinylbutyl, 2- and 4-propylsulfinylbutyl and 4-butylsulfinylbutyl;

2-methylsulfonylethyl, 2-ethylsulfonylethyl, 2-propylsulfonylethyl, 2-isopropylsulfonylethyl, 2-butylsulfonylethyl, 2- and 3-methylsulfonylpropyl, 2- and 3-ethylsulfonylpropyl, 2- and 3-propylsulfonylpropyl, 2- and 3-butylsulfonylpropyl, 2- and 4-methylsulfonylbutyl, 2- and 4-ethylsulfonylbutyl, 2- and 4-propylsulfonylbutyl and 4-butylsulfonylbutyl;

carboxymethyl, 2-carboxyethyl, 3-carboxypropyl, 4-carboxybutyl, 5-carboxypentyl, 6-carboxyhexyl, 8-carboxyoctyl, 10-carboxydecyl, 12-carboxydodecyl and 14-carboxy-tetradecyl;

sulfomethyl, 2-sulfoethyl, 3-sulfopropyl, 4-sulfobutyl, 5-sulfopentyl, 6-sulfohexyl, 8-sulfooctyl, 10-sulfodecyl, 12-sulfododecyl and 14-sulfotetradecyl;

2-hydroxyethyl, 2- and 3-hydroxypropyl, 3- and 4-hydroxybutyl and 8-hydroxy-4-oxaoctyl;

2-cyanoethyl, 3-cyanopropyl, 3- and 4-cyanobutyl;

2-chloroethyl, 2- and 3-chloropropyl, 2-, 3- and 4-chlorobutyl, 2-bromoethyl, 2- and 3-bromopropyl and 2-, 3- and 4-bromobutyl;

2-nitroethyl, 2- and 3-nitropropyl and 2-, 3- and 4-nitrobutyl;

methoxy, ethoxy, propoxy, butoxy, pentoxy and hexoxy;

methylthio, ethylthio, propylthio, butylthio, pentylthio and hexylthio;

ethynyl, 1- and 2-propynyl, 1-, 2- and 3-butynyl, 1-, 2-, 3- and 4-pentynyl, 1-, 2-, 3-, 4- and 5-hexynyl, 1-, 2-, 3-, 4-, 5-, 6-, 7-, 8- and 9-decynyl, 1-, 2-, 3-, 4-, 5-, 6-, 7-, 8-, 9-, 10- and 11-dodecynyl and 1-, 2-, 3-, 4-, 5-, 6-, 7-, 8-, 9-, 10-, 11-, 12-, 13-, 14-, 15-, 16- and 17-octadecynyl;

ethenyl, 1- and 2-propenyl, 1-, 2- and 3-butenyl, 1-, 2-, 3- and 4-pentenyl, 1-, 2-, 3-, 4- and 5-hexenyl, 1-, 2-, 3-, 4-, 5-, 6-, 7-, 8- and 9-decenyl, 1-, 2-, 3-, 4-, 5-, 6-, 7-, 8-, 9-, 10- and 11-dodecenyl and 1-, 2-, 3-, 4-, 5-, 6-, 7-, 8-, 9-, 10-, 11-, 12-, 13-, 14-, 15-, 16- and 17-octadecenyl;

methylamino, ethylamino, propylamino, butylamino, pentylamino, hexylamino, dicyclopentylamino, dicyclohexylamino, dicycloheptylamino, diphenylamino and dibenzylamino;

formylamino, acetylamino, propionylamino and benzoylamino;

carbamoyl, methylaminocarbonyl, ethylaminocarbonyl, propylaminocarbonyl, butylaminocarbonyl, pentylaminocarbonyl, hexylaminocarbonyl, heptylaminocarbonyl, octylaminocarbonyl, nonylaminocarbonyl, decylaminocarbonyl and phenylamino-carbonyl;

aminosulfonyl, N-dodecylaminosulfonyl, N,N-diphenylaminosulfonyl, and, N-bis(4-chlorophenyl)aminosulfonyl;

methoxycarbonyl, ethoxycarbonyl, propoxycarbonyl hexoxycarbonyl, dodecyloxycarbonyl, octadecyloxycarbonyl, phenoxycarbonyl, (4-tert-butyl-phenoxy)carbonyl and (4-chlorophenoxy)carbonyl;

methoxysulfonyl, ethoxysulfonyl, propoxysulfonyl, butoxysulfonyl, hexoxysulfonyl, dodecyloxysulfonyl, octadecyloxysulfonyl, phenoxysulfonyl, 1- and 2-naphthyloxysulfonyl, (4-tert-butylphenoxy)sulfonyl and (4-chlorophenoxy)sulfonyl;

diphenylphosphino, di-(o-tolyl)phosphino and diphenylphosphinoxido;

fluorine, chlorine, bromine and iodine;

phenylazo, 2-napthylazo, 2-pyridylazo and 2-pyrimidylazo;

cyclopropyl, cyclobutyl, cyclopentyl, 2- and 3-methylcyclopentyl, 2- and 3-ethylcyclopentyl, cyclohexyl, 2-, 3- and 4-methylcyclohexyl, 2-, 3- and 4-ethylcyclohexyl, 3- and 4-propylcyclohexyl, 3- and 4-isopropylcyclohexyl, 3- and 4-butylcyclohexyl, 3- and 4-sec-butylcyclohexyl, 3- and 4-tert-butylcyclohexyl, cycloheptyl, 2-, 3- and 4-methylcycloheptyl, 2-, 3- and 4-ethylcycloheptyl, 3- and 4-propylcycloheptyl, 3- and 4-isopropylcycloheptyl, 3- and 4-butylcycloheptyl, 3- and 4-sec-butylcycloheptyl, 3- and 4-tert-butylcycloheptyl, cyclooctyl, 2-, 3-, 4- and 5-methylcyclooctyl, 2-, 3-, 4- and 5-ethylcyclooctyl and 3- and 5-propylcyclooctyl; 3- and 4-hydroxycyclohexyl, 3- and 4-nitrocyclohexyl and 3- and 4-chlorocyclohexyl;

1-, 2- and 3-cyclopentenyl, 1-, 2-, 3- and 4-cyclohexenyl, 1-, 2- and 3-cycloheptenyl and 1-, 2-, 3- and 4-cyclooctenyl;

2-dioxanyl, 1-morpholinyl, 1-thiomorpholinyl, 2- and 3-tetrahydrofuryl, 1-, 2- and 3-pyrrolidinyl, 1-piperazyl, 1-diketopiperazyl and 1-, 2-, 3- and 4-piperidyl;

phenyl, 2-naphthyl, 2- and 3-pyrryl, 2-, 3- and 4-pyridyl, 2-, 4- and 5-pyrimidyl, 3-, 4- and 5-pyrazolyl, 2-, 4- and 5-imidazolyl, 2-, 4- and 5-thiazolyl, 3-(1,2,4-triazyl), 2-(1,3,5-triazyl), 6-quinaldyl, 3-, 5-, 6- and 8-quinolinyl, 2-benzoxazolyl, 2-benzothiazolyl, 5-benzothiadiazolyl, 2- and 5-benzimidazolyl and 1- and 5-isoquinolyl;

1-, 2-, 3-, 4-, 5-, 6- and 7-indolyl, 1-, 2-, 3-, 4-, 5-, 6- and 7-isoindolyl, 5-(4-methylisoindolyl), 5-(4-phenylisoindolyl), 1-, 2-, 4-, 6-, 7- and 8-(1,2,3,4-tetrahydroisoquinolinyl), 3-(5-phenyl)-(1,2,3,4-tetrahydroisoquinolinyl), 5-(3-dodecyl)-(1,2,3,4-tetrahydroisoquinolinyl), 1-, 2-, 3-, 4-, 5-, 6-, 7- and 8-(1,2,3,4-tetrahydroquinolinyl) and 2-, 3-, 4-, 5-, 6-, 7- and 8-chromanyl, 2-, 4- and 7-quinolinyl, 2-(4-phenylquinolinyl) and 2-(5-ethylquinolinyl);

2-, 3- and 4-methylphenyl, 2,4-, 3,5- and 2,6-dimethylphenyl, 2,4,6-trimethylphenyl, 2-, 3- and 4-ethylphenyl, 2,4-, 3,5- and 2,6-diethylphenyl, 2,4,6-triethylphenyl, 2-, 3- and 4-propylphenyl, 2,4-, 3,5- and 2,6-dipropylphenyl, 2,4,6-tripropylphenyl, 2-, 3- and 4-isopropylphenyl, 2,4-, 3,5- and 2,6-diisopropylphenyl, 2,4,6-triisopropylphenyl, 2-, 3- and 4-butylphenyl, 2,4-, 3,5- and 2,6-dibutylphenyl, 2,4,6-tributylphenyl, 2-, 3- and 4-isobutylphenyl, 2,4-, 3,5- and 2,6-diisobutylphenyl, 2,4,6-triisobutylphenyl, 2-, 3- and 4-sec-butylphenyl, 2,4-, 3,5- and 2,6-di-sec-butylphenyl and 2,4,6-tri-sec.butylphenyl;

2-, 3- and 4-methoxyphenyl, 2,4-, 3,5- and 2,6-dimethoxyphenyl, 2,4,6-trimethoxyphenyl, 2-, 3- and 4-ethoxyphenyl, 2,4-, 3,5- and 2,6-diethoxyphenyl, 2,4,6-triethoxyphenyl, 2-, 3- and 4-propoxyphenyl, 2,4-, 3,5- and 2,6-dipropoxyphenyl, 2-, 3- and 4-isopropoxyphenyl, 2,4- and 2,6-diisopropoxyphenyl and 2-, 3- and 4-butoxyphenyl; 2-, 3- and 4-chlorophenyl and 2,4-, 3,5- and 2,6-dichlorophenyl; 2-, 3- and 4-hydroxy-phenyl and 2,4-, 3,5- and 2,6-dihydroxyphenyl; 2-, 3- and 4-cyanophenyl; 3- and 4-carboxyphenyl; 3- and 4-carboxamidophenyl, 3- and 4-N-methylcarboxamidophenyl and 3- and 4-N-ethylcarboxamidophenyl; 3- and 4-acetylaminophenyl, 3- and 4-propionylaminophenyl and 3- and 4-butyrylaminophenyl; 3- and 4-N-phenylamino-phenyl, 3- and 4-N-(o-tolyl)aminophenyl, 3- and 4-N-(m-tolyl)aminophenyl and 3- and 4-(p-tolyl)aminophenyl; 3- and 4-(2-pyridyl)aminophenyl, 3- and 4-(3-pyridyl)aminophenyl, 3- and 4-(4-pyridyl)aminophenyl, 3- and 4-(2-pyrimidyl)aminophenyl and 4-(4-pyrimidyl)aminophenyl;

4-phenylazophenyl, 4-(1-naphthylazo)phenyl, 4-(2-naphthylazo)phenyl, 4-(4-naphthyl-azo)phenyl, 4-(2-pyriylazo)phenyl, 4-(3-pyridylazo)phenyl, 4-(4-pyridylazo)phenyl, 4-(2-pyrimidylazo)phenyl, 4-(4-pyrimidylazo)phenyl and 4-(5-pyrimidylazo)phenyl;

phenoxy, phenylthio, 2-naphthoxy, 2-naphthylthio, 2-, 3- and 4-pyridyloxy, 2-, 3- and 4-pyridylthio, 2-, 4- and 5-pyrimidyloxy and 2-, 4- and 5-pyrimidylthio.

Preferred fluorinated $R^a$ and $R^b$ radicals are as follows:

2,2,2-trifluoroethyl, 2,2,3,3,3-pentafluoropropyl, 2,2-difluoroethyl, 2,2,3,3,4,4,4-heptafluorobutyl, 2,2,3,3,3-pentafluoropropyl, 1H,1H-pentadecafluorooctyl, 3-bromo-3,3-difluoropropyl, 3,3,3-trifluoropropyl, 3,3,3-trifluoropropyl, 1H,1H,2H,2H-perfluorodecyl, 3-(perfluorooctyl)propyl, 4,4-difluorobutyl-, 4,4,4-trifluorobutyl, 5,5,6,6,6-pentafluorohexyl, 2,2-difluoropropyl, 2,2,2-trifluoro-1-phenylethylamino, 1-benzyl-2,2,2-trifluoroethyl, 2-bromo-2,2-difluoroethyl, 2,2,2-trifluoro-1-pyridin-2-ylethyl, 2,2-difluoropropyl, 2,2,2-trifluoro-1-(4-methoxyphenyl)ethylamino, 2,2,2-trifluoro-1-phenylethyl, 2,2-difluoro-1-phenylethyl, 1-(4-bromophenyl)-2,2,2-trifluoroethyl, 3-bromo-3,3-difluoropropyl, 3,3,3-trifluoropropylamine, 3,3,3-trifluoro-n-propyl, 1H,1H,2H,2H-perfluorodecyl, 3-(perfluorooctyl)propyl, pentafluorophenyl, 2,3,5,6-tetrafluorophenyl, 4-cyano-(2,3,5,6)-tetrafluorophenyl, 4-carboxy-2,3,5,6-tetrafluorophenyl, 2,4-difluorophenyl, 2,4,5-trifluorophenyl, 2,4,6-trifluorophenyl, 2,5-difluorophenyl, 2-fluoro-5-nitrophenyl, 2-fluoro-5-trifluoromethylphenyl, 2-fluoro-5-methylphenyl, 2,6-difluorophenyl, 4-carboxamido-2,3,5,6-tetrafluorophenyl, 2-bromo-4,6-difluorophenyl, 4-bromo-2-fluorophenyl, 2,3-difluorophenyl, 4-chloro-2-fluorophenyl, 2,3,4-trifluorophenyl, 2-fluoro-4-iodphenyl, 4-bromo-2,3,5,6-tetrafluorophenyl, 2,3,6-trifluorophenyl, 2-bromo-3,4,6-trifluorophenyl, 2-bromo-4,5,6-trifluorophenyl, 4-bromo-2,6-difluorophenyl, 2,3,4,5-tetrafluorophenyl, 2,4-difluoro-6-nitrophenyl, 2-fluoro-4-nitrophenyl, 2-chloro-6-fluorophenyl, 2-fluoro-4-methylphenyl, 3-chloro-2,4-difluorophenyl, 2,4-dibromo-6-fluorophenyl, 3,5-dichloro-2,4-difluorophenyl, 4-cyano-2-fluorophenyl, 2-chloro-4-fluorophenyl, 2-fluoro-3-trifluoromethylphenyl, 2-trifluoromethyl-6-fluorophenyl, 2,3,4,6-tetrafluorophenyl, 3-chloro-2-fluorophenyl, 5-chloro-2-fluorophenyl, 2-bromo-4-chloro-6-fluorophenyl, 2,3-dicyano-4,5,6-trifluorophenyl, 2,4,5-trifluoro-3-carboxyphenyl, 2,3,4-trifluoro-6-carboxyphenyl, 2,3,5-trifluorophenyl, 4-trifluoromethyl-2,3,5,6-tetrafluorophenyl, 2-fluoro-5-carboxyphenyl, 2-chloro-4,6-difluorophenyl, 6-bromo-3-chloro-2,4-difluorophenyl, 2,3,4-trifluoro-6-nitrophenyl, 2,5-difluoro-4-cyanophenyl, 2,5-difluoro-4-trifluoromethylphenyl, 2,3-difluoro-6-nitrophenyl, 4-trifluoromethyl-2,3-difluorophenyl, 2-bromo-4,6-difluorophenyl, 4-bromo-2-fluorophenyl, 2-nitrotetrafluorophenyl, 2,2',3,3',4',5,5',6,6'-nonafluorobiphenyl, 2-nitro-3,5,6-trifluorophenyl, 2-bromo-6-fluorophenyl, 4-chloro-2-fluoro-6-iodphenyl, 2-fluoro-6-carboxyphenyl, 2,4-difluoro-3-trifluorophenyl, 2-fluoro-4-trifluoromethyl, 2-fluoro-4-carboxyphenyl, 4-bromo-2,5-difluorophenyl, 2,5-dibromo-3,4,6-trifluorophenyl, 2-fluoro-5-methylsulfonylpenyl, 5-bromo-2-fluorophenyl, 2-fluoro-4-hydroxymethylphenyl, 3-fluoro-4-bromomethylphenyl, 2-nitro-4-trifluoromethylphenyl, 4-trifluoromethylphenyl, 2-bromo-4-trifluoromethylphenyl, 2-bromo-6-chloro-4-(trifluoromethyl)phenyl, 2-chloro-4-trifluoromethylphenyl, 3-nitro-4-(trifluoromethyl)phenyl, 2,6-dichloro-4-(trifluormethyl)phenyl, 4-trifluorophenyl, 2,6-dibromo-4-(trifluoromethyl)phenyl, 4-trifluoromethyl-2,3,5,6-tetrafluorophenyl, 3-fluoro-4-trifluoromethylphenyl, 2,5-difluoro-4-trifluoromethylphenyl, 3,5-difluoro-4-trifluoromethylphenyl, 2,3-difluoro-4-trifluoromethylphenyl, 2,4-bis(trifluoromethyl)phenyl, 3-chloro-4-trifluoromethylphenyl, 2-bromo-4,5-di(trifluoromethyl)phenyl, 5-chloro-2-nitro-4-(trifluoromethyl)phenyl, 2,4,6-tris(trifluoromethyl)phenyl, 3,4-bis(trifluoromethyl)phenyl, 2-fluoro-3-trifluoromethylphenyl, 2-iod-4-trifluoromethylphenyl, 2-nitro-4,5-bis(trifluoromethyl)phenyl, 2-methyl-4-(trifluoromethyl)phenyl, 3,5-dichloro-4-(trifluoromethyl)phenyl, 2,3,6-trichloro-4-(trifluoromethyl)phenyl, 4-(trifluoromethyl)benzyl, 2-fluoro-4-(trifluoromethyl)benzyl, 3-fluoro-4-(trifluoromethyl)benzyl, 3-chloro-4-(trifluoromethyl)benzyl, 4-fluorophenethyl, 3-(trifluoromethyl)phenethyl, 2-chloro-6-fluorophenethyl, 2,6-dichlorophenethyl, 3-fluorophenethyl, 2-fluorophenethyl, (2-trifluoromethyl)phenethyl, 4-fluorophenethyl, 3-fluorophenethyl, 4-trifluoromethylphenethyl, 2,3-difluorophenethyl, 3,4-difluorophenethyl, 2,4-difluorophenethyl, 2,5-difluorophenethyl, 3,5-difluorophenethyl, 2,6-difluorophenethyl, 4-(4-fluorophenyl)phenethyl, 3,5-di(trifluoromethyl)phenethyl, pentafluorophenethyl, 2,4-di(trifluoromethyl)phenethyl, 2-nitro-4-(trifluoro-methyl)phenethyl, (2-fluoro-3-trifluoromethyl)phenethyl, (2-fluoro-5-trifluoro-methyl)phenethyl, (3-fluoro-5-trifluoromethyl)phenethyl, (4-fluoro-2-trifluoromethyl)phenethyl, (4-fluoro-3-trifluoromethyl)phenethyl, (2-fluoro-6-trifluoro-methyl)phenethyl, (2,3,6-trifluoro)phenethyl, (2,4,5-trifluoro)phenethyl, (2,4,6-trifluoro)phenethyl, (2,3,4-trifluoro)phenethyl, (3,4,5-trifluoro)phenethyl, (2,3,5-trifluoro)phenethyl, (2-chloro-5-fluoro)phenethyl, (3-fluoro-4-trifluoromethyl)phenethyl, (2-chloro-5-trifluoromethyl)phenethyl, (2-fluoro-3-chloro-5-trifluoromethyl)phenethyl, (2-fluoro-3-chloro)phenethyl, (4-fluoro-3-chloro)phenethyl, (2-fluoro-4-chloro)phenethyl, (2,3-difluoro-4-methyl)phenethyl-, 2,6-difluoro-3-chlorophenethyl, (2,6-difluoro-3-methyl)phenethyl, (2-trifluoromethyl-5-chloro)phenethyl, (6-chloro-2-fluoro-5-methyl)phenethyl, (2,4-dichloro-5-fluoro)phenethyl, 5-chloro-2-fluorophenethyl, (2,5-difluoro-6-chloro)phenethyl, (2,3,4,5-tetrafluoro)phenethyl, (2-fluoro-4-trifluoromethyl)phenethyl, 2,3-(difluoro-4-trifluoromethyl)phenethyl, (2,5-di(trifluoromethyl))phenethyl, 2-fluoro-3,5-dibromophenethyl, (3-fluoro-4-nitro)phenethyl, (2-bromo-4-trifluoromethyl)phenethyl, 2-(bromo-5-fluoro)phenethyl, (2,6-difluoro-4-bromo)phenethyl, (2,6-difluoro-4-chloro)phenethyl, (3-chloro-5-fluoro)phenethyl, (2-bromo-5-trifluoromethyl)phenethyl and the like.

A further embodiment relates to compounds of the formula (I) where the $R^a$ and $R^b$ groups are each groups of the formula (A) (so-called swallowtail radicals). In the groups of the formula (A), the $R^e$ radicals are preferably selected from $C_4$-$C_8$-alkyl, preferably $C_5$-$C_7$-alkyl. The $R^a$ and $R^b$ groups are then each a group of the formula

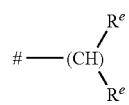

(A)

in which
# is the bonding site to the imide nitrogen atom and
the $R^e$ radicals are selected from $C_4$-$C_8$-alkyl, preferably $C_5$-$C_7$-alkyl. The $R^e$ radicals are then especially linear alkyl radicals which are not interrupted by oxygen atoms. A preferred example of a group of the formula (A) is 1-hexylhept-1-yl.

Preference is given to compounds of the formula (I) where the $R^{11}$, $R^{12}$, $R^{13}$, $R^{14}$, $R^{21}$, $R^{22}$, $R^{23}$ and $R^{24}$ radicals each have a definition other than hydrogen, i.e. compounds of the formula (I) where the $R^{11}$, $R^{12}$, $R^{13}$, $R^{14}$, $R^{21}$, $R^{22}$, $R^{23}$ and $R^{24}$ radicals are each chlorine and/or fluorine, where 1 or 2 of the $R^{11}$, $R^{12}$, $R^{13}$, $R^{14}$, $R^{21}$, $R^{22}$, $R^{23}$ and $R^{24}$ radicals may also be cyano.

Additionally preferred are compounds of the formula (I) where the $R^{11}$, $R^{12}$, $R^{13}$, $R^{14}$, $R^{21}$, $R^{22}$, $R^{23}$ and $R^{24}$ radicals are each chlorine and/or fluorine, where one of the $R^{11}$, $R^{12}$, $R^{13}$, $R^{14}$, $R^{21}$, $R^{22}$, $R^{23}$ and $R^{24}$ radicals may also be hydrogen.

Particular preference is given to compounds of the formula (I) where the $R^{11}$, $R^{12}$, $R^{13}$, $R^{14}$, $R^{21}$, $R^{22}$, $R^{23}$ and $R^{24}$ radicals are all chlorine and/or fluorine. Very particular preference is given to compounds of the formula (I) where the $R^{11}$, $R^{12}$, $R^{13}$, $R^{14}$, $R^{21}$, $R^{22}$, $R^{23}$ and $R^{24}$ radicals are all chlorine or are all fluorine.

Perylenetetracarboxylic dianhydrides are referred to hereinafter as compounds (I.A).

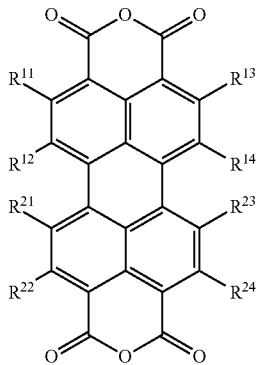
(I.A)

Perylenetetracarboximides are referred to hereinafter as compounds (I.B), where compounds (I.Ba)

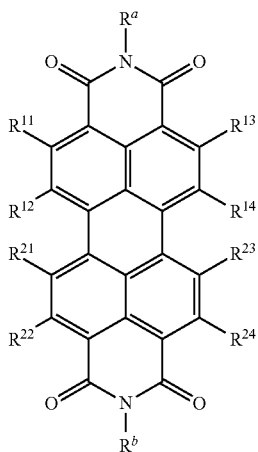
(I.Ba)

do not have an additional bridging X group, and compounds (I.Bb1) and (I.Bb2)

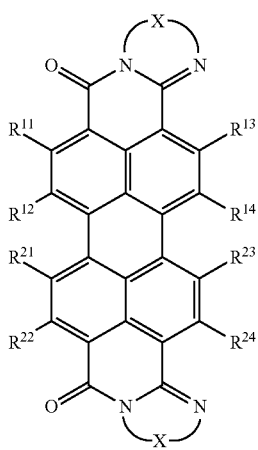
(I.Bb1)

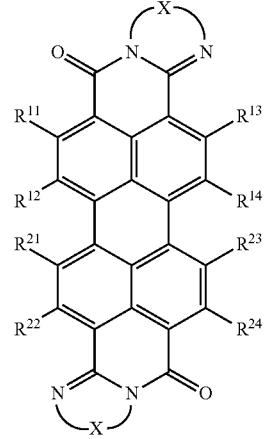
(I.Bb2)

do have such an additional bridging X group.

A first specific embodiment relates to compounds of the general formula (I.A) where $R^{11}$, $R^{12}$, $R^{13}$, $R^{14}$, $R^{21}$, $R^{22}$, $R^{23}$ and $R^{24}$ each have the definitions specified above.

A further specific embodiment relates to compounds of the general formula (I.Ba) where $R^a$, $R^b$, $R^{11}$, $R^{12}$, $R^{13}$, $R^{14}$, $R^{21}$, $R^{22}$, $R^{23}$ and $R^{24}$ each have one of the definitions given above.

In this specific embodiment, the $R^a$ and $R^b$ radicals are preferably each independently hydrogen or unsubstituted or substituted alkyl, alkenyl, alkadienyl, alkynyl, cycloalkyl, bicycloalkyl, cycloalkenyl, heterocycloalkyl, aryl or hetaryl.

More preferably, at least one of the $R^a$ or $R^b$ radicals in the compounds of the formula (I.Ba) is hydrogen. More preferably, both $R^a$ and $R^b$ are hydrogen.

In a further specific embodiment, the $R^a$ and $R^b$ radicals are the same.

A further specific embodiment relates to compounds of the general formulae (I.Bb1) and (I.Bb2) where $R^{11}$, $R^{12}$, $R^{13}$, $R^{14}$, $R^{21}$, $R^{22}$, $R^{23}$ and $R^{24}$ each have the definitions given above and X is a divalent bridging group having from 2 to 5 atoms between the flanking bonds.

The bridging X groups together with the N—C═N group to which they are bonded are preferably a 5- to 8-membered heterocycle which is optionally fused once, twice or three times to cycloalkyl, heterocycloalkyl, aryl and/or hetaryl, where the fused groups may each independently bear one, two, three or four substituents selected from alkyl, alkoxy, cycloalkyl, aryl, halogen, hydroxyl, mercapto, COOH, carboxylate, $SO_3H$, sulfonate, $NE^1E^2$, alkylene-$NE^1E^2$, nitro and cyano, where $E^1$ and $E^2$ are each independently hydrogen, alkyl, cycloalkyl, heterocycloalkyl, aryl or hetaryl, and/or X may have one, two or three substituents which are selected from optionally substituted alkyl, optionally substituted cycloalkyl and optionally substituted aryl, and/or X may be interrupted by one, two or three optionally substituted heteroatoms. The heteroatoms are preferably selected from oxygen, sulfur and nitrogen.

The bridging X groups are preferably selected from groups of the formulae (III.a) to (III.d)

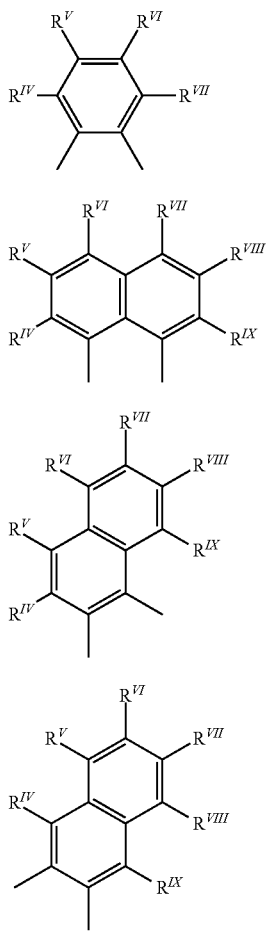

(III.a)

(III.b)

(III.c)

(III.d)

in which
$R^{IV}, R^V, R^{VI}, R^{VIII}$ and $R^{IX}$ are each independently hydrogen, alkyl, alkoxy, cycloalkyl, cycloalkoxy, heterocycloalkyl, heterocycloalkoxy, aryl, aryloxy, hetaryl, hetaryloxy, halogen, hydroxyl, mercapto, COOH, carboxylate, $SO_3H$, sulfonate, $NE^1E^2$, alkylene-$NE^1E^2$, nitro, alkoxycarbonyl, acyl or cyano, where $E^1$ and $E^2$ are each independently hydrogen, alkyl, cycloalkyl, heterocycloalkyl, aryl or hetaryl.

In a specific embodiment, the $R^{IV}, R^V, R^{VIII}$ and $R^{IX}$ radicals in the (III.a) to (III.d) groups are each hydrogen.

A further specific embodiment relates to compounds of the general formula (I), especially compounds of the formulae (I.A), (I.Ba), (I.Bb1) or (I.Bb2), in which $R^{11}, R^{12}, R^{13}, R^{14}, R^{21}, R^{22}, R^{23}$ and $R^{24}$ are each fluorine, where 1 or 2 of the $R^{11}, R^{12}, R^{13}, R^{14}, R^{21}, R^{22}, R^{23}$ and $R^{24}$ radicals may be CN and/or 1 $R^{11}, R^{12}, R^{13}, R^{14}, R^{21}, R^{22}, R^{23}$ and $R^{24}$ radical may be hydrogen. However, preferably all $R^{11}, R^{12}, R^{13}, R^{14}, R^{21}, R^{22}, R^{23}$ and $R^{24}$ radicals are fluorine.

A further specific embodiment relates to compounds of the general formula (I), especially compounds of the formulae (I.A), (I.Ba), (I.Bb1) or (I.Bb2), in which some of the $R^{11}, R^{12}, R^{13}, R^{14}, R^{21}, R^{22}, R^{23}$ and $R^{24}$ radicals are fluorine and the other $R^{11}, R^{12}, R^{13}, R^{14}, R^{21}, R^{22}, R^{23}$ and $R^{24}$ radicals are chlorine, where 1 or 2 of the $R^{11}, R^{12}, R^{13}, R^{14}, R^{21}, R^{22}, R^{23}$ and $R^{24}$ radicals may each be CN and/or 1 $R^{11}, R^{12}, R^{13}, R^{14}, R^{21}, R^{22}, R^{23}$ and $R^{24}$ radical may be hydrogen. Preferably, four of the $R^{11}, R^{12}, R^{13}, R^{14}, R^{21}, R^{22}, R^{23}$ and $R^{24}$ radicals are fluorine and the four remaining $R^{11}, R^{12}, R^{13}, R^{14}, R^{21}, R^{22}, R^{23}$ and $R^{24}$ radicals are chlorine.

Specific examples of suitable compounds of the formula (I) are those shown below:

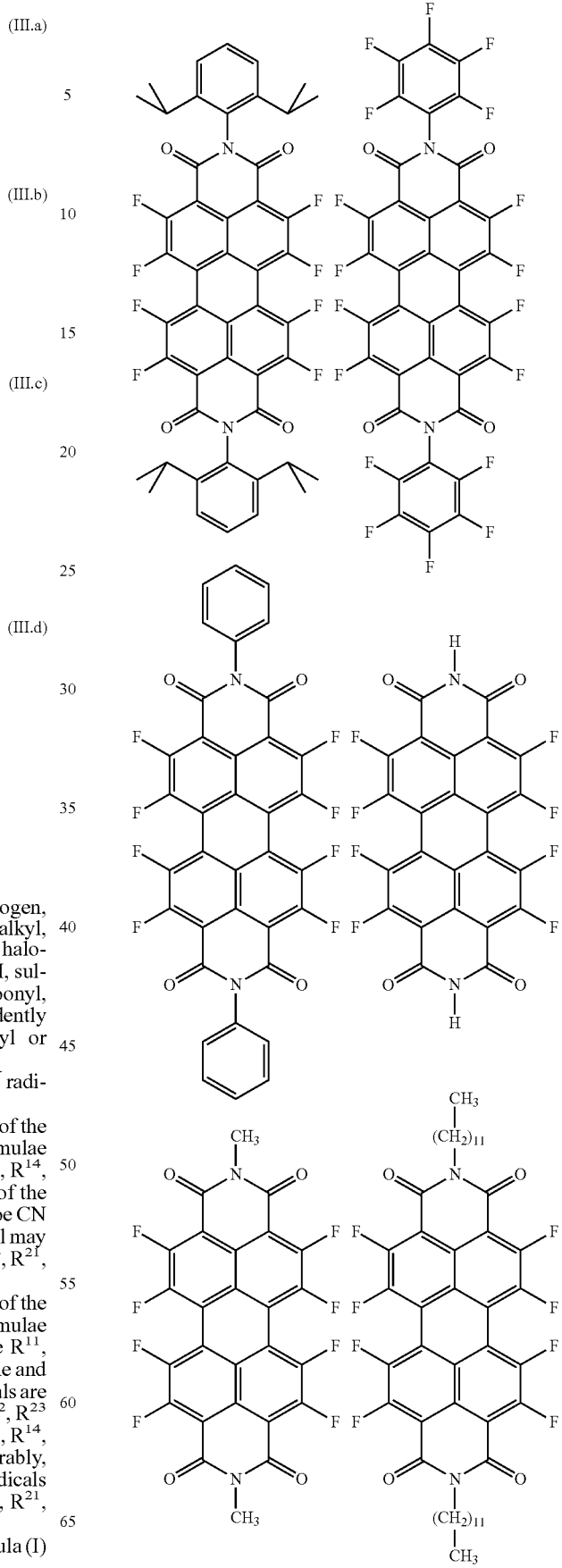

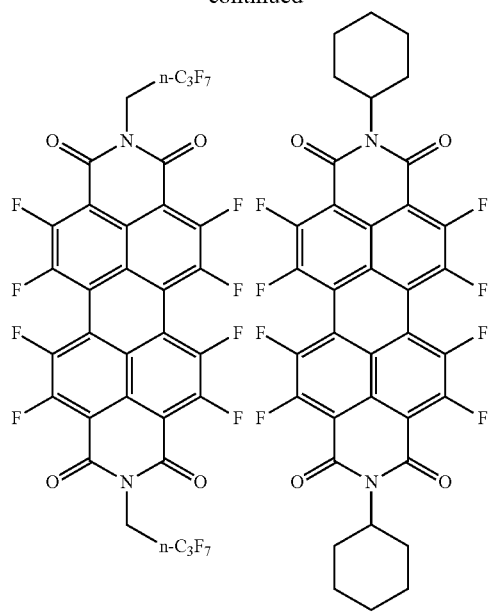
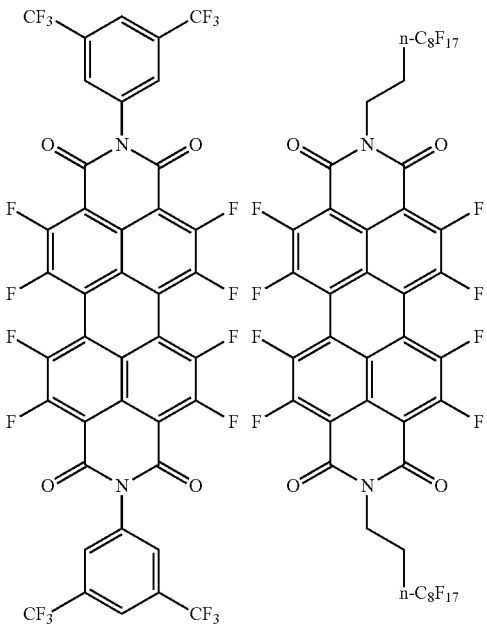
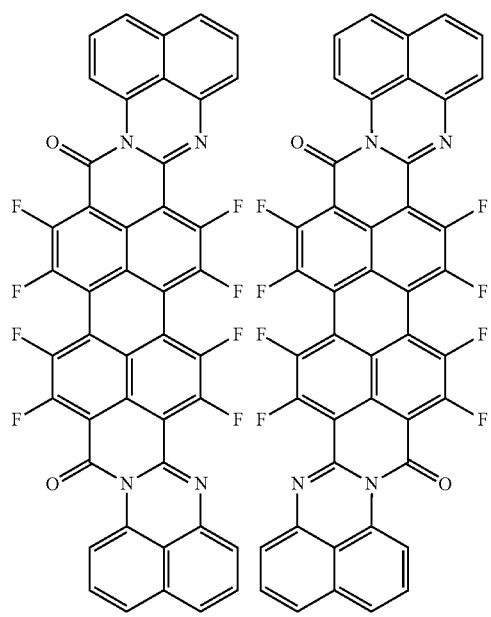
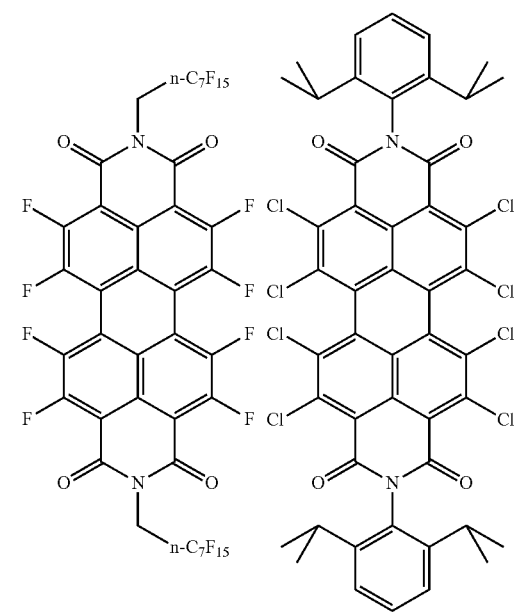

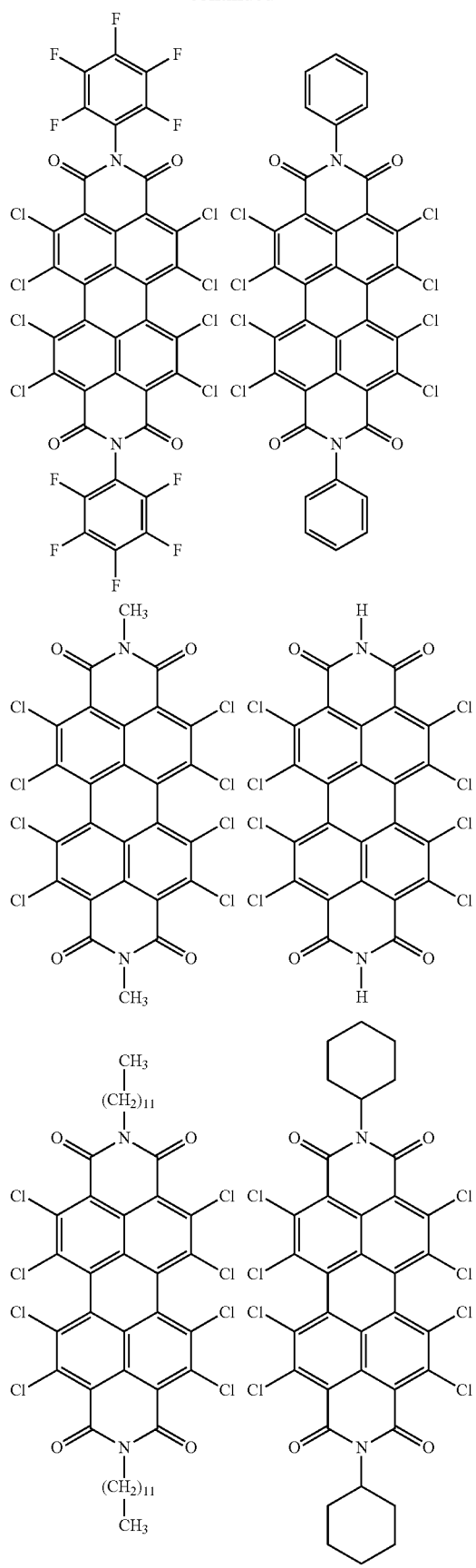
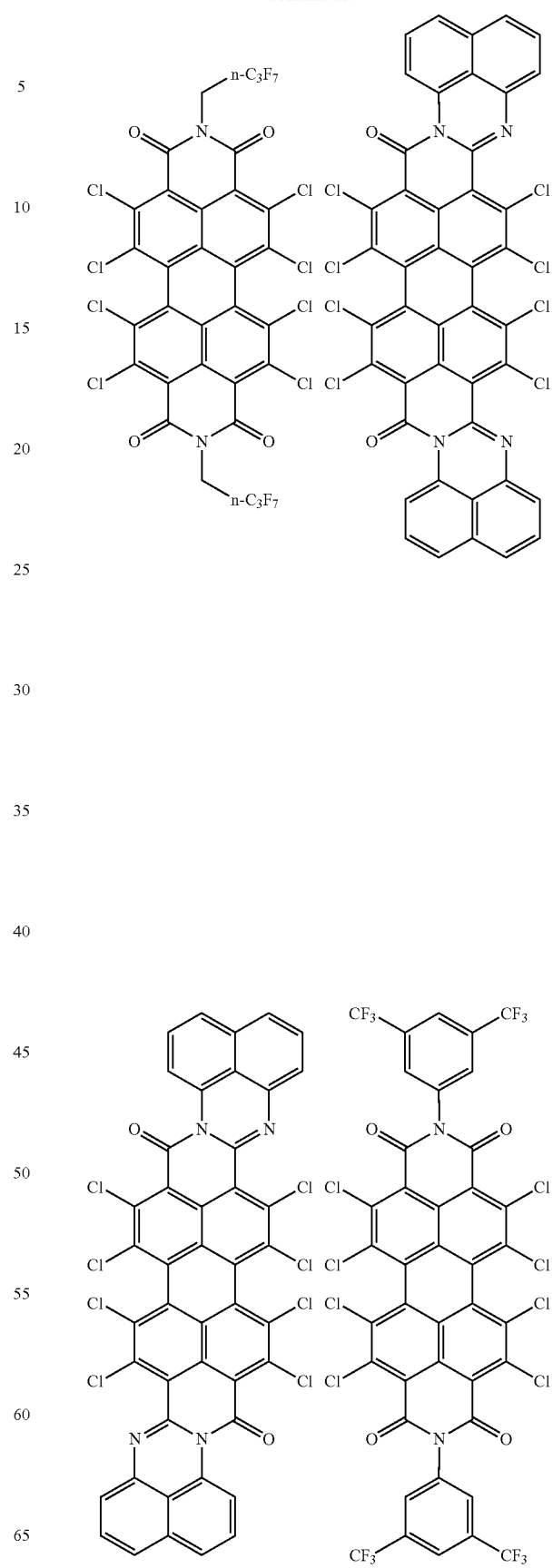

-continued
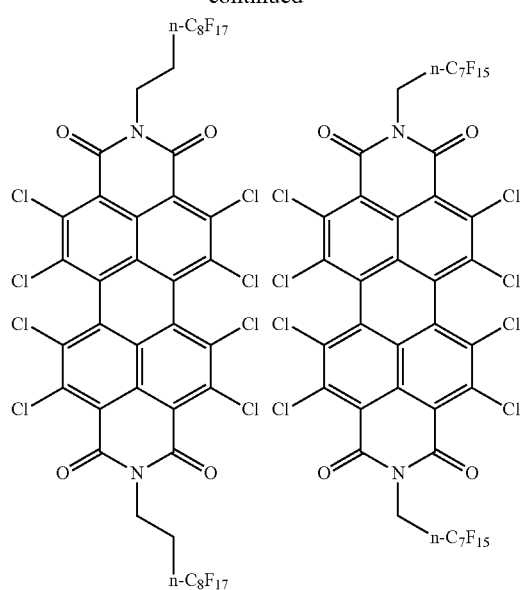
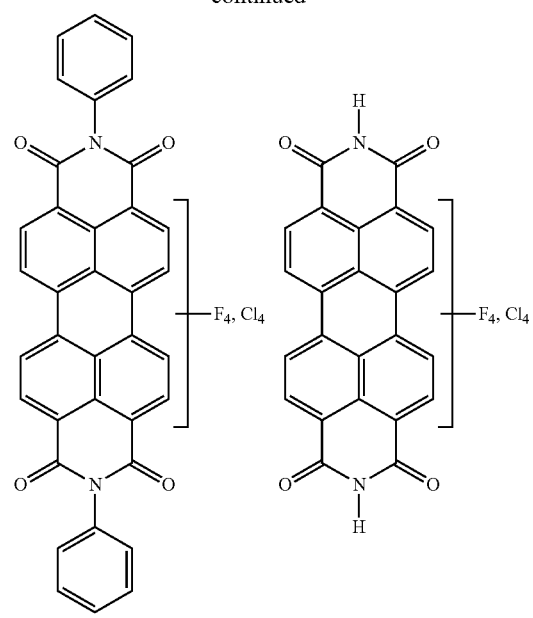
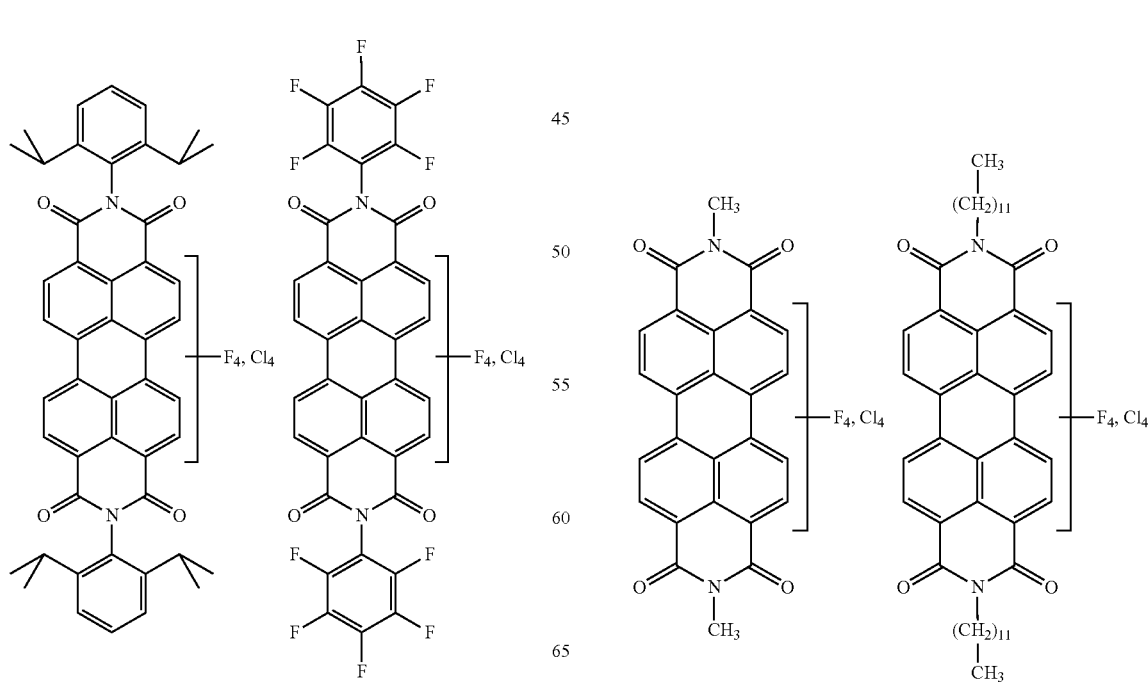

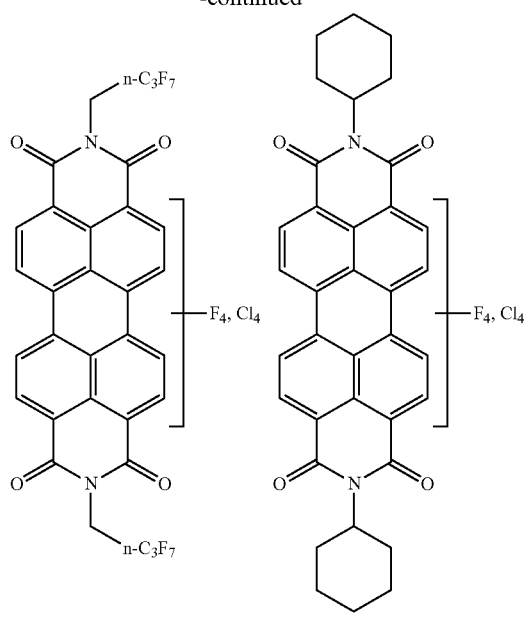
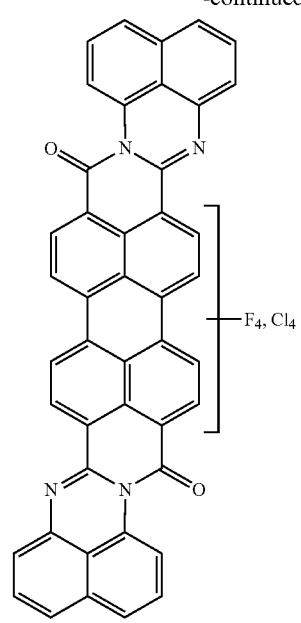
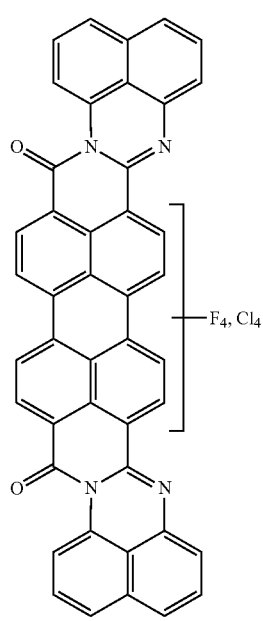
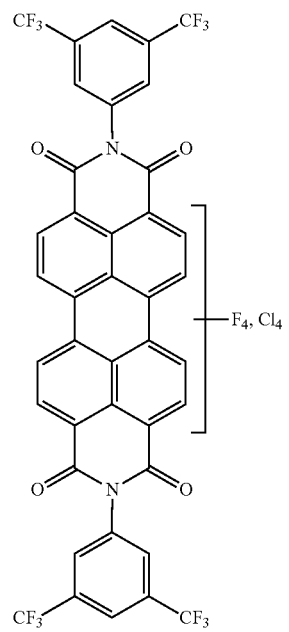

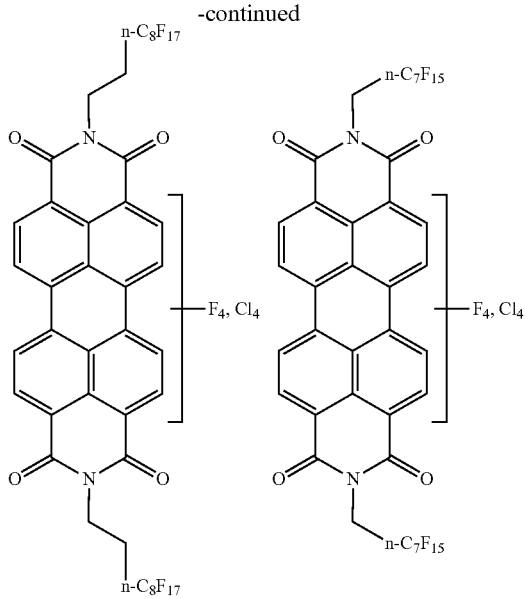

The inventive compounds of the general formula (I) can be prepared proceeding from known compounds with the same perylene base skeleton which, as $R^{11}$, $R^{12}$, $R^{13}$, $R^{14}$, $R^{21}$, $R^{22}$, $R^{23}$ and $R^{24}$ radicals, have at least one hydrogen atom.

Accordingly, the present invention further relates to a process for preparing compounds of the formula (I)

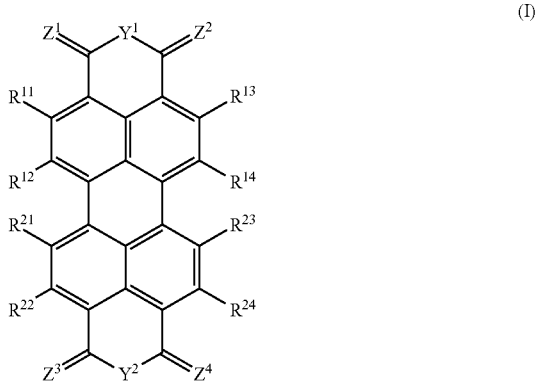

where $R^{11}$, $R^{12}$, $R^{13}$, $R^{14}$, $R^{21}$, $R^{22}$, $R^{23}$, $R^{24}$, $Y^1$, $Y^2$, $Z^1$, $Z^2$, $Z^3$ and $Z^4$ each have one of the definitions given above,
in which
a) a compound of the formula (II)

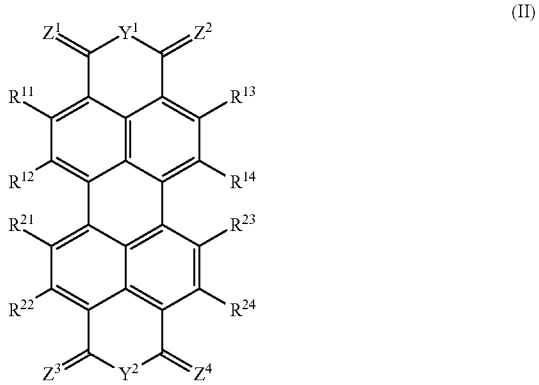

in which
$R^{11}$, $R^{12}$, $R^{13}$, $R^{14}$, $R^{21}$, $R^{22}$, $R^{23}$, $R^{24}$ are each selected from hydrogen, Cl and CN, and
$Y^1$, $Y^2$, $Z^1$, $Z^2$, $Z^3$ and $Z^4$ each have one of the definitions given above,
where at least one of the $R^{11}$, $R^{12}$, $R^{13}$, $R^{14}$, $R^{21}$, $R^{22}$, $R^{23}$, $R^{24}$ radicals is hydrogen, from 0 to 7 of the $R^{11}$, $R^{12}$, $R^{13}$, $R^{14}$, $R^{21}$, $R^{22}$, $R^{23}$, $R^{24}$ radicals are each Cl and from 0 to 2 of the $R^{11}$, $R^{12}$, $R^{13}$, $R^{14}$, $R^{21}$, $R^{22}$, $R^{23}$, $R^{24}$ radicals are each CN,
is subjected to a chlorination to obtain a compound of the formula (I)
in which the $R^{11}$, $R^{12}$, $R^{13}$, $R^{14}$, $R^{21}$, $R^{22}$, $R^{23}$ and $R^{24}$ radicals are each chlorine, where 1 or 2 of the $R^{11}$, $R^{12}$, $R^{13}$, $R^{14}$, $R^{21}$, $R^{22}$, $R^{23}$ and $R^{24}$ radicals may also be CN, and one of the $R^{11}$, $R^{12}$, $R^{13}$, $R^{14}$, $R^{21}$, $R^{22}$, $R^{23}$ and $R^{24}$ radicals may be hydrogen,
and
b) optionally, the compound of the formula (I) obtained in step a) is subjected to a partial or full exchange of chlorine for fluorine.

Step a)

Methods of chlorinating aromatics are known in principle to those skilled in the art. The inventive compounds of the formula (I) in which the $R^{11}$, $R^{12}$, $R^{13}$, $R^{14}$, $R^{21}$, $R^{22}$, $R^{23}$ and $R^{24}$ radicals are each chlorine, where one of these radicals may also be hydrogen, can be prepared from the corresponding compounds of the formula (II) in which at least one of the $R^{11}$, $R^{12}$, $R^{13}$, $R^{14}$, $R^{21}$, $R^{22}$, $R^{23}$ and $R^{24}$ radicals is hydrogen by reaction with a chlorinating agent such as thionyl chloride, chlorosulfonic acid, sulfuryl chloride or chlorine in an inert solvent.

A particularly preferred embodiment of the present invention relates to the use of chlorosulfonic acid as a solvent (and not as a chlorinating agent) in step a) of the process according to the invention. In this configuration of the process, chlorine is then preferably used as the chlorinating agent.

The reaction of the compounds of the formula (II) with a chlorinating agent takes place preferably in the presence of a catalyst. Useful catalysts include, for example, iodine or iodobenzene, and also mixtures thereof.

In a specific embodiment of the process, the compound of the formula (II) is chlorinated by reaction with chlorine in chlorosulfonic acid and in the presence of catalytic amounts of iodine.

The reaction temperature for the reaction with a chlorinating agent is typically within a range of from 35 to 110° C., preferably from 40 to 95° C.

The reaction of the compounds of the formula (II) with a chlorinating agent can be brought about under standard pressure or under elevated pressure.

The compounds of the formula (I) are typically isolated from the reaction mixture by precipitation. The precipitation is brought about, for example, by adding a liquid which dissolves the compounds only to a slight degree, if at all, but is miscible with the inert solvents. The precipitation products can then be isolated by filtration and typically have a sufficiently high purity.

For use of the products as semiconductors, it may be advantageous to subject the product to a further purification. These include, for example, column chromatography processes, where the products are subjected to a separation or filtration on silca gel, for example dissolved in a halogenated hydrocarbon such as methylene chloride or a toluene/ethyl acetate or petroleum ether/ethyl acetate mixture. In addition, purification by sublimation or crystallization is possible.

If required, the purification steps are repeated once or more than once and/or different purification steps are combined in order to obtain very pure compounds (I).

In a preferred embodiment of the process according to the invention, the chlorination of the compound of the formula (II) is brought about by reaction with chlorine in chlorosulfonic acid (as a solvent) and in the presence of catalytic amounts of iodine. In this embodiment, the compounds of the formula (I) are preferably isolated by adding water and isolating the solid which precipitates out.

Typically, the inventive preparation of the compounds of the formula (I) will proceed from the corresponding compounds of the formula (II) in which all $R^{11}$, $R^{12}$, $R^{13}$, $R^{14}$, $R^{21}$, $R^{22}$, $R^{23}$ and $R^{24}$ radicals are hydrogen, where 1 or 2 of the $R^{11}$, $R^{12}$, $R^{13}$, $R^{14}$, $R^{21}$, $R^{22}$, $R^{23}$ and $R^{24}$ radicals may also be CN. In a specific embodiment, $R^{11}$ to $R^{14}$ and $R^{21}$ to $R^{24}$ are each hydrogen. However, it may also be advantageous to proceed from partly chlorinated compounds of the formula (II), especially when they are more readily obtainable owing to the increased reactivity of their precursor compounds.

When the $R^a$, $R^b$ radicals have aromatic groups, they may also be chlorinated under the chlorinating conditions described above. For this reason, it may be appropriate first to chlorinate the perylene base skeleton and to introduce the $R^a$, $R^b$ radicals thereafter, for example by an imidation reaction. Step b)

The preparation of the inventive compounds of the general formula (I) in which at least some of the $R^{11}$, $R^{12}$, $R^{13}$, $R^{14}$, $R^{21}$, $R^{22}$, $R^{23}$ and $R^{24}$ radicals are fluorine can proceed from the compounds of the formula (I) which have the same rylene base skeleton and are provided in step a), by partial or full exchange of chlorine for fluorine. Conditions for such a halogen exchange are sufficiently well known to those skilled in the art. Depending on the reaction conditions selected, the halogen exchange can be brought about fully or only partly.

In a preferred embodiment of the process according to the invention, compounds of the formula (I) in which at least some of the $R^{11}$, $R^{12}$, $R^{13}$, $R^{14}$, $R^{21}$, $R^{22}$, $R^{23}$ and $R^{24}$ radicals are fluorine will be prepared by reacting the compound of the formula (I) obtained in step a) with an alkali metal fluoride under essentially anhydrous conditions.

In the context of the invention, "essentially anhydrous conditions" are understood to mean a total water content, based on all components involved in the reaction (reactants, solvents, complexing agents, etc.), of at most 2% by weight, preferably of at most 1% by weight, especially of at most 0.1% by weight. To achieve the anhydrous reaction conditions, the components involved in the reaction can be subjected to drying by customary processes known to those skilled in the art.

Suitable process conditions for aromatic nucleophilic substitution of chlorine atoms by fluorine atoms (halogen exchange) are known in principle. Suitable conditions for halogen exchange are described, for example, in J. March, Advanced Organic Chemistry, 4th edition, publisher: John Wiley & Sons (1992), p. 659, and in DE 32 35 526.

In a first embodiment, the reaction is an exchange of the chlorine atoms for fluorine atoms. To introduce the fluorine groups, preference is given to using an alkali metal fluoride, especially KF, NaF or CsF. Preference is given to using from 1 to 30 equivalents of alkali metal fluoride per equivalent of rylene compound.

Preferred solvents for the halogen exchange are aprotic polar solvents such as dimethylformamide, N-methylpyrrolidone, $(CH_3)_2SO$, dimethyl sulfone, N,N'-dimethylimidazolidinone or sulfolane. Particular preference is given to using sulfolane as the solvent. Before use, the solvents are preferably subjected to drying to remove water by customary methods known to those skilled in the art. Likewise suitable are aprotic solvents such as aromatic hydrocarbons, e.g. xylenes, for example o-xylene.

Typically, the compound of the formula (I) obtained in step a) will be subjected to halogen exchange in the form of a solution which has a concentration of from 0.002 to 0.2 mol/l, preferably from 0.01 to 0.1 mol/l, in one of the aforementioned solvents.

For the halogen exchange, it is additionally possible to use a complexing agent, for example a crown ether. These include, for example, [12]crown-4, [15]crown-5, [18]crown-6, [21]crown-7, [24]crown-8, etc. The complexing agent is selected according to its ability to complex the alkali metals of the alkali metal halides used for the halogen exchange. When KF is used to introduce the fluorine groups, the complexing agent used is preferably [18]crown-6. Preference is given to using from 0.1 to 10 equivalents of crown ether per equivalent of rylene compound.

Further suitable phase transfer catalysts are, for example, selected from 2-azaallenium compounds, carbophosphazenium compounds, aminophosphonium compounds and diphosphazenium compounds. A. Pleschke, A. Marhold, M. Schneider, A. Kolomeitsev and G. V. Röschenthaler, in the Journal of Fluorine Chemistry 125, 2004, 1031-1038, give a review of suitable phase transfer catalysts. Reference is made to the disclosure of this document. In a preferred embodiment, 2-azaallenium compounds, such as (N,N-dimethylimidazolidino)tetramethylguanidinium chloride, are used. The amount of these phase transfer catalysts used is preferably from 0.1 to 20% by weight, preferably from 1 to 10% by weight, based on the weight of the rylene compound used.

The reaction temperatures for the halogen exchange are preferably from 100 to 200° C. The reaction time is preferably from 0.5 to 48 hours.

Compounds of the formula (II) in which 1 or 2 of the $R^{11}$, $R^{12}$, $R^{13}$, $R^{14}$, $R^{21}$, $R^{22}$, $R^{23}$ and $R^{24}$ radicals are each CN can be brought about proceeding compounds with the same rylene base skeleton which have 1 or 2 exchangeable chlorine atoms as $R^{11}$, $R^{12}$, $R^{13}$, $R^{14}$, $R^{21}$, $R^{22}$, $R^{23}$ and $R^{24}$ radicals by exchange of the chlorine atoms for cyano. Conditions for such an exchange reaction are known to those skilled in the art.

Compounds of the formula (II) in which 1 or 2 of the $R^{11}$, $R^{12}$, $R^{13}$, $R^{14}$, $R^{21}$, $R^{22}$, $R^{23}$ and $R^{24}$ radicals are CN may also be prepared proceeding from compounds with the same rylene base skeleton which possess 1 or 2 exchangeable bromine atoms as $R^{11}$, $R^{12}$, $R^{13}$, $R^{14}$, $R^{21}$, $R^{22}$, $R^{23}$ and $R^{24}$ radicals, by exchanging the bromine atoms for cyano. Conditions for such an exchange reaction are known to those skilled in the art.

For the exchange of bromine or chlorine for cyano, examples of suitable compounds are alkali metal cyanides such as KCN and NaCN, and especially zinc cyanide. The reaction is effected preferably in the presence of at least one transition metal catalyst. Suitable transition metal catalysts are especially palladium complexes such as tetrakis(triphenylphosphine)palladium(0), tetrakis(tris-o-tolylphosphine)palladium(0), [1,2-bis(diphenylphosphino)ethane]palladium(II) chloride, [1,1'-bis(diphenylphosphino)-ferrocene]palladium(II) chloride, bis(triethylphosphine)palladium(II) chloride, bis(tricyclohexylphosphine)palladium(II) acetate, (2,2'-bipyridyl)palladium(II) chloride, bis(triphenylphosphine)palladium(II) chloride, tris(dibenzylideneacetone)dipalladium(0), 1,5-cyclooctadienepalladium(II) chloride, bis(acetonitrile)palladium(II) chloride and bis(benzonitrile)palladium(II) chloride, preference being given to [1,1'-bis(diphenylphosphino)ferrocene]palladium(II) chloride and tetrakis(triphenyl-phosphine)palladium(0).

For the exchange of bromine or chlorine for cyano, preference is given to using aromatic hydrocarbons as solvents.

These preferably include benzene, toluene, xylenes, etc. Particular preference is given to using toluene.

Compounds of the general formula (I) or (II) in which 1, 2, 3 or 4 of the $Z^1$, $Z^2$, $Z^3$ or $Z^4$ groups are S are obtainable from the corresponding compounds of the formula (I) in which the $Z^1$, $Z^2$, $Z^3$, $Z^4$ groups are each O, for example by reaction with the Davy or Lawesson reagent. The general conditions in the reaction with the Davy or Lawesson reagent are known to those skilled in the art. The more precise conditions can optionally be determined by means of simple preliminary experiments. For example, reference is made here to the article by A. Orzeszko et al., "Investigation of the Thionation Reaction of Cyclic Imides", Z. Naturforsch. 56b, 1035-1040, 2001, in which the exchange of the carbonyl oxygen for sulfur on cyclic imides is investigated.

However, a preferred embodiment of the present invention relates to compounds of the formula (I) in which the $Z^1$, $Z^2$, $Z^3$ and $Z^4$ radicals are each O and to the use thereof.

Tetracarboximides of the formulae (I.Ba), (I.Bb1) and (I.Bb2) are preparable by the process according to the invention proceeding from the corresponding rylenetetracarboximides in which at least one of the $R^{11}$, $R^{12}$, $R^{13}$, $R^{14}$, $R^{21}$, $R^{22}$, $R^{23}$ and $R^{24}$ radicals is hydrogen. Typically, the starting materials used for their preparation will, however, be the rylenetetracarboxylic dianhydrides of the formula (II.A) which are known per se.

Accordingly, the present invention further relates to processes for preparing compounds of the formula (I.Ba)

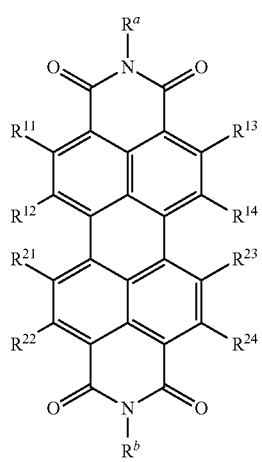

(I.Ba)

in which $R^{11}$, $R^{12}$, $R^{13}$, $R^{14}$, $R^{21}$, $R^{22}$, $R^{23}$ and $R^{24}$ each have one of the definitions given above, in which 1) a rylene dianhydride of the formula (II.A)

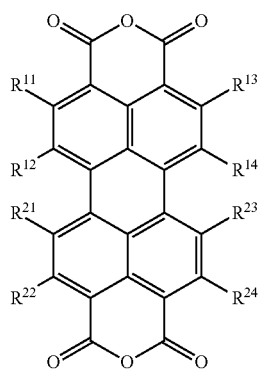

(II.A)

in which $R^{11}$, $R^{12}$, $R^{13}$, $R^{14}$, $R^{21}$, $R^{22}$, $R^{23}$, $R^{24}$ are each selected from hydrogen, Cl and CN, where at least one of the $R^{11}$, $R^{12}$, $R^{13}$, $R^{14}$, $R^{21}$, $R^{22}$, $R^{23}$, $R^{24}$ radicals is hydrogen, from 0 to 7 of the $R^{11}$, $R^{12}$, $R^{13}$, $R^{14}$, $R^{21}$, $R^{22}$, $R^{23}$, $R^{24}$ radicals are each Cl and from 0 to 2 of the $R^{11}$, $R^{12}$, $R^{13}$, $R^{14}$, $R^{21}$, $R^{22}$, $R^{23}$, $R^{24}$ radicals are each CN, is subjected to step a) and optionally step b) of the process according to the invention, and 2) the compound obtained in step 1) is subjected to a reaction with an amine of the formula $R^a$—$NH_2$ and optionally a different amine of the formula $R^b$—$NH_2$.

Alternatively, the compounds of the formula (I.Ba) can be prepared by a process wherein 1') a rylene dianhydride of the formula (II.A) is subjected first to a reaction with an amine of the formula $R^a$—$NH_2$ and optionally a different amine of the formula $R^b$—$NH_2$, and 2') the compound obtained in step 1') is subjected to step a) and optionally step b) of the process according to the invention.

The present invention further relates to a process for preparing compounds of the formulae (I.Bb1) and/or (I.Bb2),

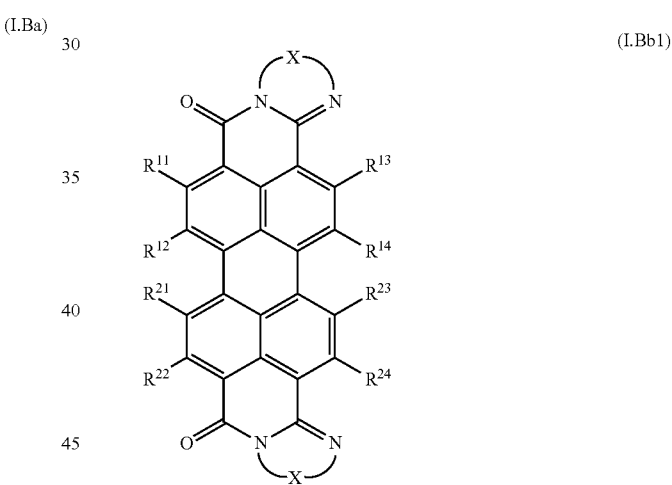

(I.Bb1)

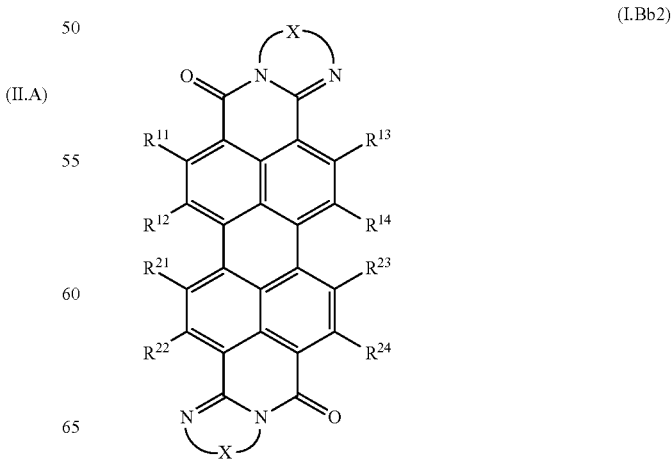

(I.Bb2)

where $R^{11}$, $R^{12}$, $R^{13}$, $R^{14}$, $R^{21}$, $R^{22}$, $R^{23}$ and $R^{24}$ and X each have one of the definitions given above, in which
1'') a rylene dianhydride of the formula (II.A),

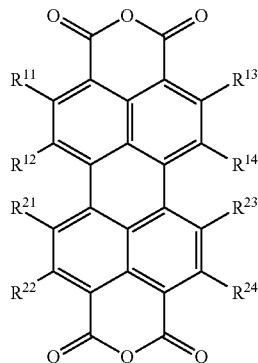

(II.A)

in which
$R^{11}$, $R^{12}$, $R^{13}$, $R^{14}$, $R^{21}$, $R^{22}$, $R^{23}$, $R^{24}$ are each selected from hydrogen, Cl and CN, and
where at least one of the $R^{11}$, $R^{12}$, $R^{13}$, $R^{14}$, $R^{21}$, $R^{22}$, $R^{23}$, $R^{24}$ radicals is hydrogen, from 0 to 7 of the $R^{11}$, $R^{12}$, $R^{13}$, $R^{14}$, $R^{21}$, $R^{22}$, $R^{23}$, $R^{24}$ radicals are each Cl and from 0 to 2 of the $R^{11}$, $R^{12}$, $R^{13}$, $R^{14}$, $R^{21}$, $R^{22}$, $R^{23}$, $R^{24}$ radicals are each CN,
is subjected to step a) and optionally step b) of the process according to the invention, and
2'') the compound obtained in step 1'') is subjected to a reaction with an amine of the formula $H_2N-X-NH_2$.

Alternatively, the compounds of the formulae (I.Bb1) and/or (I.Bb2) can be prepared by a process in which
1''') a rylene dianhydride of the formula (II.A) is subjected to a reaction with an amine of the formula $H_2N-X-NH_2$, and
2''') the compound obtained in step 1''') is subjected to step a) and optionally to step b) of the process according to the invention.

The imidation of the carboxylic anhydride groups in reaction steps 2), 1'), 2'') and 1''') is known in principle and is described, for example, in DE 10 2004 007 382 A1. Preference is given to reacting the dianhydride with the primary amine in the presence of an aromatic solvent such as toluene, xylene, mesitylene, phenol, or of a polar aprotic solvent. Suitable polar aprotic solvents are nitrogen heterocycles such as pyridine, pyrimidine, quinoline, isoquinoline, quinaldine, N-methylpiperidine, N-methylpiperidone and N-methylpyrrolidone. For reaction with an aromatic diamine of the formula $H_2N-X-NH_2$, preference is given to using a nitrogen heterocycle or phenol as a solvent. Suitable catalysts are those specified below. When phenol is used as the solvent, the catalyst used is preferably piperazine.

The reaction can be undertaken in the presence of an imidation catalyst. Suitable imidation catalysts are organic and inorganic acids, for example formic acid, acetic acid, propionic acid and phosphoric acid. Suitable imidation catalysts are also organic and inorganic salts of transition metals, such as zinc, iron, copper and magnesium. These include, for example, zinc acetate, zinc propionate, zinc oxide, iron(II) acetate, iron(III) chloride, iron(II) sulfate, copper(II) acetate, copper(II) oxide and magnesium acetate. An imidation catalyst is used preferably in the reaction of aromatic amines and is generally also advantageous for the reaction of cycloaliphatic amines. In the reaction of aliphatic amines, especially of short-chain aliphatic amines, it is generally possible to dispense with the use of an imidation catalyst. The amount of the imidation catalyst used is preferably from 5 to 80% by weight, more preferably from 10 to 75% by weight, based on the total amount of the compound to be imidated.

The molar ratio of amine to dianhydride is preferably from about 2:1 to 10:1, more preferably from 2:1 to 4:1, for example from 2.2:1 to 3:1.

The organic acids mentioned above as imidation catalysts are also suitable as solvents.

The reaction temperature in steps 2), 1'), 2'') and 1''') is generally from ambient temperature to 200° C., preferably from 40 to 160° C. Aliphatic and cycloaliphatic amines are reacted preferably within a temperature range from about 60° C. to 100° C. Aromatic amines are reacted preferably within a temperature range from about 120 to 160° C.

Preference is given to effecting the reaction in reaction steps 2), 1'), 2'') and 1''') under a protective gas atmosphere, for example nitrogen.

Reaction steps 2), 1'), 2'') and 1''') can be effected under standard pressure or, if desired, under elevated pressure. A suitable pressure range is in the range from about 0.8 to 10 bar. When volatile amines (boiling point about ≤180° C.) are used, one preferred possibility is use under elevated pressure.

The water formed in the reaction in steps 2), 1'), 2'') and 1''') can be removed by distillation by processes known to those skilled in the art.

In general, the diamines obtained in reaction step 2), 1'), 2'') and 1''') can be used without further purification. For use of the products as semiconductors, it may, however, be advantageous to subject the products to a further purification. This includes, for example, column chromatography processes, in which case the products are preferably dissolved in a halogenated hydrocarbon such as methylene chloride or in an aromatic hydrocarbon, and subjected to a separation or filtration on silica gel.

The inventive compounds and those obtainable by the process according to the invention are particularly advantageously suitable as organic semiconductors. They generally function as n-semiconductors. When the compounds of the formula (I) used in accordance with the invention are combined with other semiconductors and the position of the energy levels causes the other semiconductors to function as n-semiconductors, the compounds (I) may also function as p-semiconductors in exceptional cases.

The compounds of the formula (I) are notable for their air stability. Moreover, they have a high charge transport mobility which clearly sets them apart from known organic semiconductor materials. They additionally have a high on/off ratio.

The compounds of the formula (I) are particularly advantageously suitable for organic field-effect transistors. They may be used, for example, for the production of integrated circuits (ICs), for which customary n-channel MOSFETs (metal oxide semiconductor field-effect transistors) have been used to date. These are then CMOS-like semiconductor units, for example for microprocessors, microcontrollers, static RAM and other digital logic circuits. For the production of semiconductor materials, the compounds of the formula (I) can be processed further by one of the following processes: printing (offset, flexographic, gravure, screenprinting, inkjet, electrophotography), evaporation, laser transfer, photolithography, drop-casting. They are especially suitable for use in displays (specifically large-surface area and/or flexible displays) and RFID tags.

The compounds of the formula (I) are particularly advantageously suitable as electron conductors in organic field-effect transistors, organic solar cells and in organic light-emitting diodes. They are also particularly advantageous as an exciton transport material in excitonic solar cells.

The compounds of the formula (I) are also particularly advantageously suitable as fluorescent dyes in a display based on fluorescence conversion. Such displays comprise generally a transparent substrate, a fluorescent dye present on the substrate and a radiation source. Typical radiation sources emit blue (color by blue) or UV light (color by uv). The dyes absorb either the blue or the UV light and are used as green emitters. In these displays, for example, the red light is generated by exciting the red emitter by means of a green emitter which absorbs blue or UV light. Suitable color-by-blue displays are described, for example, in WO 98/28946. Suitable color-by-UV displays are described, for example, by W. A. Crossland, I. D. Sprigle and A. B. Davey in Photoluminescent LCDs (PL-LCD) using phosphors, Cambridge University and Screen Technology Ltd., Cambridge, UK. The compounds of the formula (I) are also particularly suitable in displays which, based on an electrophoretic effect, switch colors on and off via charged pigment dyes. Such electrophoretic displays are described, for example, in US 2004/0130776.

The invention further provides organic field-effect transistors comprising a substrate with at least one gate structure, a source electrode and a drain electrode, and at least one compound of the formula (I) as defined above as a semiconductor, especially as an n-semiconductor.

The invention further provides substrates having a plurality of organic field-effect transistors, wherein at least some of the field-effect transistors comprise at least one compound of the formula (I) as defined above as an n-semiconductor.

The invention also provides semiconductor units which comprise at least one such substrate.

A specific embodiment is a substrate with a pattern (topography) of organic field-effect transistors, each transistor comprising
    an organic semiconductor disposed on the substrate;
    a gate structure for controlling the conductivity of the conductive channel; and
    conductive source and drain electrodes at the two ends of the channel,
the organic semiconductor consisting of at least one compound of the formula (I) or comprising a compound of the formula (I). In addition, the organic field-effect transistor generally comprises a dielectric.

A further specific embodiment is a substrate having a pattern of organic field-effect transistors, each transistor forming an integrated circuit or being part of an integrated circuit and at least some of the transistors comprising at least one compound of the formula (I).

Suitable substrates are in principle the materials known for this purpose. Suitable substrates comprise, for example, metals (preferably metals of groups 8, 9, 10 or 11 of the Periodic Table, such as Au, Ag, Cu), oxidic materials (such as glass, ceramics, $SiO_2$, especially quartz), semiconductors (e.g. doped Si, doped Ge), metal alloys (for example based on Au, Ag, Cu, etc.), semiconductor alloys, polymers (e.g. polyvinyl chloride, polyolefins such as polyethylene and polypropylene, polyesters, fluoropolymers, polyamides, polyimides, polyurethanes, polyalkyl(meth)acrylates, polystyrene and mixtures and composites thereof), inorganic solids (e.g. ammonium chloride), paper and combinations thereof. The substrates may be flexible or inflexible, and have a curved or planar geometry, depending on the desired use.

A typical substrate for semiconductor units comprises a matrix (for example a quartz or polymer matrix) and, optionally, a dielectric top layer.

Suitable dielectrics are $SiO_2$, polystyrene, poly-α-methylstyrene, polyolefins (such as polypropylene, polyethylene, polyisobutene), polyvinylcarbazole, fluorinated polymers (e.g. Cytop), cyanopullulans (e.g. CYMM), polyvinylphenol, poly-p-xylene, polyvinyl chloride, or polymers crosslinkable thermally or by atmospheric moisture. Specific dielectrics are "self-assembled nanodielectrics", i.e. polymers which are obtained from monomers comprising SiCl functionalities, for example $Cl_3SiOSiCl_3$, $Cl_3Si-(CH_2)_6-SiCl_3$, $Cl_3Si-(CH_2)_{12}-SiCl_3$, and/or which are crosslinked by atmospheric moisture or by addition of water diluted with solvents (see, for example, Faccietti Adv. Mat. 2005, 17, 1705-1725). Instead of water, it is also possible for hydroxyl-containing polymers such as polyvinylphenol or polyvinyl alcohol or copolymers of vinylphenol and styrene to serve as crosslinking components. It is also possible for at least one further polymer to be present during the crosslinking operation, for example polystyrene, which is then also crosslinked (see Facietti, US patent application 2006/0202195).

The substrate may additionally have electrodes, such as gate, drain and source electrodes of OFETs, which are normally localized on the substrate (for example deposited onto or embedded into a nonconductive layer on the dielectric). The substrate may additionally comprise conductive gate electrodes of the OFETs, which are typically arranged below the dielectric top layer (i.e. the gate dielectric).

In a specific embodiment, an insulator layer (gate insulating layer) is present on at least part of the substrate surface. The insulator layer comprises at least one insulator which is preferably selected from inorganic insulators such as $SiO_2$, $Si_3N_4$, etc., ferroelectric insulators such as $Al_2O_3$, $Ta_2O_5$, $La_2O_5$, $TiO_2$, $Y_2O_3$, etc., organic insulators such as polyimides, benzocyclobutene (BCB), polyvinyl alcohols, polyacrylates, etc., and combinations thereof.

Suitable materials for source and drain electrodes are in principle electrically conductive materials. These include metals, preferably metals of groups 6, 8, 9, 10 or 11 of the Periodic Table, such as Pd, Au, Ag, Cu, Al, Ni, Cr, etc. Also suitable are conductive polymers such as PEDOT (=poly(3,4-ethylenedioxythiophene)): PSS (=poly(styrenesulfonate)), polyaniline, surface-modified gold, etc. Preferred electrically conductive materials have a specific resistance of less than $10^{-3}$ ohm×meter, preferably less than $10^{-4}$ ohm×meter, especially less than $10^{-6}$ or $10^{-7}$ ohm×meter.

In a specific embodiment, drain and source electrodes are present at least partly on the organic semiconductor material. It will be appreciated that the substrate may comprise further components as used customarily in semiconductor materials or ICs, such as insulators, resistors, capacitors, conductor tracks, etc.

The electrodes may be applied by customary processes, such as evaporation, lithographic processes or another structuring process.

The semiconductor materials may also be processed with suitable auxiliaries (polymers, surfactants) in disperse phase by printing.

In a first preferred embodiment, the deposition of at least one compound of the general formula (I) (and optionally further semiconductor materials) is carried out by a gas phase deposition process (physical vapor deposition, PVD). PVD processes are performed under high-vacuum conditions and comprise the following steps: evaporation, transport, deposition. It has been found that, surprisingly, the compounds of the general formula (I) are suitable particularly advantageously for use in a PVD process, since they essentially do not decompose and/or form undesired by-products. The material deposited is obtained in high purity. In a specific embodiment, the deposited material is obtained in the form of crystals or comprises a high crystalline content. In general, for the PVD, at least one compound of the general formula (I) is heated to a temperature above its evaporation temperature and deposited on a substrate by cooling below the crystallization temperature. The temperature of the substrate in the deposition is preferably within a range from about 20 to 250° C., more preferably from 50 to 200° C. It has been found that, surprisingly, elevated substrate temperatures in the deposition of the compounds of the formula (I) can have advantageous effects on the properties of the semiconductor elements achieved.

The resulting semiconductor layers generally have a thickness which is sufficient for ohmic contact between source and drain electrodes. The deposition can be effected under an inert atmosphere, for example, under nitrogen, argon or helium.

The deposition is effected typically at ambient pressure or under reduced pressure. A suitable pressure range is from about $10^{-7}$ to 1.5 bar.

The compound of the formula (I) is preferably deposited on the substrate in a thickness of from 10 to 1000 nm, more preferably from 15 to 250 nm. In a specific embodiment, the compound of the formula (I) is deposited at least partly in crystalline form. For this purpose, especially the above-described PVD process is suitable. Moreover, it is possible to use previously prepared organic semiconductor crystals. Suitable processes for obtaining such crystals are described by R. A. Laudise et al. in "Physical Vapor Growth of Organic Semi-Conductors", Journal of Crystal Growth 187 (1998), pages 449-454, and in "Physical Vapor Growth of Centimeter-sized Crystals of α-Hexathiophene", Journal of Crystal Growth 1982 (1997), pages 416-427, which are incorporated here by reference.

In a second preferred embodiment, the deposition of at least one compound of the general formula (I) (and optionally further semiconductor materials) is effected by spin-coating. Surprisingly, it is thus also possible to use the compounds of the formula (I) used in accordance with the invention in a wet processing method to produce semiconductor substrates. The compounds of the formula (I) should thus also be suitable for producing semiconductor elements, especially OFETs or based on OFETs, by a printing process. It is possible for this purpose to use customary printing processes (inkjet, flexographic, offset, gravure; intaglio printing, nanoprinting). Preferred solvents for the use of compounds of the formula (I) in a printing process are aromatic solvents such as toluene, xylene, etc. It is also possible to add thickening substances such as polymers, for example polystyrene, etc., to these "semiconductor inks". In this case, the dielectrics used are the aforementioned compounds.

In a preferred embodiment, the inventive field-effect transistor is a thin-film transistor (TFT). In a customary construction, a thin-film transistor has a gate electrode disposed on the substrate, a gate insulation layer disposed thereon and on the substrate, a semiconductor layer disposed on the gate insulator layer, an ohmic contact layer on the semiconductor layer, and a source electrode and a drain electrode on the ohmic contact layer.

In a preferred embodiment, the surface of the substrate, before the deposition of at least one compound of the general formula (I) (and optionally of at least one further semiconductor material), is subjected to a modification. This modification serves to form regions which bind the semiconductor materials and/or regions on which no semiconductor materials can be deposited. The surface of the substrate is preferably modified with at least one compound (C1) which is suitable for binding to the surface of the substrate and to the compounds of the formula (I). In a suitable embodiment, a portion of the surface or the complete surface of the substrate is coated with at least one compound (C1) in order to enable improved deposition of at least one compound of the general formula (I) (and optionally further semiconductive compounds). A further embodiment comprises the deposition of a pattern of compounds of the general formula (C1) on the substrate by a corresponding production process. These include the mask processes known for this purpose and so-called "patterning" processes, as described, for example, in U.S. Ser. No. 11/353,934, which is incorporated here fully by reference.

Suitable compounds of the formula (C1) are capable of a binding interaction both with the substrate and with at least one semiconductor compound of the general formula (I). The term "binding interaction" comprises the formation of a chemical bond (covalent bond), ionic bond, coordinative interaction, van der Waals interactions, e.g. dipole-dipole interactions etc.), and combinations thereof. Suitable compounds of the general formula (C1) are:

silane, phosphonic acids, carboxylic acids, hydroxamic acids, such as alkyltrichlorosilanes, e.g. n-octadecyltrichlorosilane; compounds with trialkoxysilane groups, e.g. alkyltrialkoxysilanes such as n-octadecyltrimethoxysilane, n-octadecyltriethoxysilane, n-octadecyltri(n-propyl)oxysilane, n-octadecyltri(isopropyl)oxysilane; trialkoxyaminoalkylsilanes such as triethoxyaminopropylsilane and N-[(3-triethoxysilyl)propyl]ethylenediamine; trialkoxyalkyl 3-glycidyl ether silanes such as triethoxypropyl 3-glycidyl ether silane; trialkoxyallylsilanes such as allyltrimethoxysilane; trialkoxy(isocyanato-alkyl)silanes; trialkoxysilyl(meth)acryloyloxyalkanes and trialkoxysilyl(meth)-acrylamidoalkanes such as 1-triethoxysilyl-3-acryloyloxypropane.

amines, phosphines and sulfur-comprising compounds, especially thiols.

The compound (C1) is preferably selected from alkyltrialkoxysilanes, especially n-octadecyltrimethoxysilane, n-octadecyltriethoxysilane; hexaalkyldisilazanes, and especially hexamethyldisilazane (HMDS); $C_8$-$C_{30}$-alkylthiols, especially hexadecanethiol; mercaptocarboxylic acids and mercaptosulfonic acids, especially mercaptoacetic acid, 3-mercaptopropionic acid, mercaptosuccinic acid, 3-mercapto-1-propanesulfonic acid and the alkali metal and ammonium salts thereof.

Various semiconductor architectures comprising the inventive semiconductors are also conceivable, for example top contact, top gate, bottom contact, bottom gate, or else a vertical construction, for example a VOFET (vertical organic field-effect transistor), as described, for example, in US 2004/0046182.

The layer thicknesses are, for example, from 10 nm to 5 μm in semiconductors, from 50 nm to 10 μm in the dielectric; the electrodes may, for example, be from 20 nm to 1 μm. The OFETs may also be combined to form other components such as ring oscillators or inverters.

A further aspect of the invention is the provision of electronic components which comprise a plurality of semiconductor components, which may be n- and/or p-semiconductors. Examples of such components are field-effect transistors (FETs), bipolar junction transistors (BJTs), tunnel diodes, converters, light-emitting components, biological and chemical detectors or sensors, temperature-dependent detectors, photodetectors such as polarization-sensitive photodetectors, gates, AND, NAND, NOT, OR, TOR and NOR gates, registers, switches, timer units, static or dynamic stores and other dynamic or sequential, logical or other digital components including programmable switches.

A specific semiconductor element is an inverter. In digital logic, the inverter is a gate which inverts an input signal. The inverter is also referred to as a NOT gate. Real inverter switches have an output current which constitutes the opposite of the input current. Typical values are, for example, (0, +5V) for TTL switches. The performance of a digital inverter reproduces the voltage transfer curve (VTC), i.e. the plot of input current against output current. Ideally, it is a staged function and, the closer the real measured curve approximates to such a stage, the better the inverter is. In a specific embodiment of the invention, the compounds of the formula (I) are used as organic n-semiconductors in an inverter.

The compounds of the formula (I) are also particularly advantageously suitable for use in organic photovoltaics (OPVs). These compounds are preferably suitable for use in solar cells which are characterized by diffusion of excited states (exciton diffusion). In this case, one or both of the semiconductor materials utilized is notable for a diffusion of excited states (exciton mobility). Also suitable is the combination of at least one semiconductor material which is characterized by diffusion of excited states with polymers which permit conduction of the excited states along the polymer chain. In the context of the invention, such solar cells are referred to as excitonic solar cells. The direct conversion of solar energy to electrical energy in solar cells is based on the internal photo effect of a semiconductor material, i.e. the generation of electron-hole pairs by absorption of photons and the separation of the negative and positive charge carriers at a p-n transition or a Schottky contact. An exciton can form, for example, when a photon penetrates into a semiconductor and excites an electron to transfer from the valence band into the conduction band. In order to generate current, the excited state generated by the absorbed photons must, however, reach a p-n transition in order to generate a hole and an electron which then flow to the anode and cathode. The photovoltage thus generated can bring about a photocurrent in an external circuit, through which the solar cell delivers its power. The semiconductor can absorb only those photons which have an energy which is greater than its band gap. The size of the semiconductor band gap thus determines the proportion of sunlight which can be converted to electrical energy. Solar cells consist normally of two absorbing materials with different band gaps in order to very effectively utilize the solar energy. Most organic semiconductors have exciton diffusion lengths of up to 10 nm. There is still a need here for organic semiconductors through which the excited state can be passed on over very large distances. It has now been found that, surprisingly, the compounds of the general formula (I) described above are particularly advantageously suitable for use in excitonic solar cells.

Suitable organic solar cells generally have a layer structure and generally comprise at least the following layers: anode, photoactive layer and cathode. These layers generally consist of a substrate customary therefor. The structure of organic solar cells is described, for example, in US 2005/0098726 A1 and US 2005/0224905 A1, which are fully incorporated here by reference.

Suitable substrates are, for example, oxidic materials (such as glass, ceramic, $SiO_2$, especially quartz, etc.), polymers (e.g. polyvinyl chloride, polyolefins such as polyethylene and polypropylene, polyesters, fluoropolymers, polyamides, polyurethanes, polyalkyl(meth)acrylates, polystyrene and mixtures and composites thereof) and combinations thereof.

Suitable electrodes (cathode, anode) are in principle metals (preferably of groups 2, 8, 9, 10, 11 or 13 of the Periodic Table, e.g. Pt, Au, Ag, Cu, Al, In, Mg, Ca), semiconductors (e.g. doped Si, doped Ge, indium tin oxide (ITO), gallium indium tin oxide (GITO), zinc indium tin oxide (ZITO), etc.), metal alloys (e.g. based on Pt, Au, Ag, Cu, etc., especially Mg/Ag alloys), semiconductor alloys, etc. The anode used is preferably a material essentially transparent to incident light. This includes, for example, ITO, doped ITO, ZnO, $TiO_2$, Ag, Au, Pt. The cathode used is preferably a material which essentially reflects the incident light. This includes, for example, metal films, for example of Al, Ag, Au, In, Mg, Mg/Al, Ca, etc.

For its part, the photoactive layer comprises at least one or consists of at least one layer which comprises, as an organic semiconductor material, at least one compound which is selected from compounds of the formula (I) as defined above. In one embodiment, the photoactive layer comprises at least one organic acceptor material. In addition to the photoactive layer, there may be one or more further layers, for example a layer with electron-conducting properties (ETL, electron transport layer) and a layer which comprises a hole-conducting material (hole transport layer, HTL) which need not absorb, exciton- and hole-blocking layers (e.g. EBLs) which should not absorb, multiplication layers. Suitable exciton- and hole-blocking layers are described, for example, in U.S. Pat. No. 6,451,415.

Suitable exciton blocker layers are, for example, bathocuproins (BCPs), 4,4',4"-tris[3-methylphenyl(phenyl)amino]triphenylamine (m-MTDATA) or polyethylenedioxythiophene (PEDOT), as described in U.S. Pat. No. 7,026,041.

The inventive excitonic solar cells are based on photoactive donor-acceptor heterojunctions. When at least one compound of the formula (I) is used as the HTM (hole transport material), the corresponding ETM (exciton transport material) must be selected such that, after excitation of the compounds, a rapid electron transfer to the ETM takes place. Suitable ETMs are, for example, C60 and other fullerenes, perylene-3,4:9,10-bis(dicarboximides) (PTCDIs), etc. When at least one compound of the formula (I) is used as the ETM, the complementary HTM must be selected such that, after excitation, a rapid hole transfer to the HTM takes place. The heterojunction may have a flat configuration (cf. Two layer organic photovoltaic cell, C. W. Tang, Appl. Phys. Lett., 48 (2), 183-185 (1986) or N. Karl, A. Bauer, J. Hölzapfel, J. Marktanner, M. Möbus, F. Stölzle, Mol. Cryst. Liq. Cryst., 252, 243-258 (1994).) or be implemented as a bulk heterojunction (or interpenetrating donor-acceptor network; cf., for example, C. J. Brabec, N. S. Sariciftci, J. C. Hummelen, Adv. Funct. Mater., 11 (1), 15 (2001).). The photoactive layer based on a heterojunction between at least one compound of the formula (I) and an HTL (hole transport layer) or ETL (exciton transport layer) can be used in solar cells with MiM, pin, pn, Mip or Min structure (M=metal, p=p-doped organic or inorganic semiconductor, n=n-doped organic or inorganic semiconductor, i=intrinsically conductive system of organic layers; cf., for example, J. Drechsel et al., Org. Eletron., 5 (4), 175 (2004) or Maennig et al., Appl. Phys. A 79, 1-14 (2004)). It can also be used in tandem cells, as described by P. Peumnas, A. Yakimov, S. R. Forrest in J. Appl. Phys, 93 (7), 3693-3723 (2003) (cf. patents U.S. Pat. No. 4,461,922, U.S. Pat. No. 6,198,091 and U.S. Pat. No. 6,198,092). It can also be used in tandem cells composed of two or more MiM, pin, Mip or Min diodes stacked on one another (cf. patent application DE 103 13 232.5) (J. Drechsel et al., Thin Solid Films, 451452, 515-517 (2004)).

Thin layers of the compounds and of all other layers can be produced by vapor deposition under reduced pressure or in inert gas atmosphere, by laser ablation or by solution- or dispersion-processible methods such as spin-coating, knife-coating, casting methods, spraying, dip-coating or printing (e.g. inkjet, flexographic, offset, gravure; intaglio, nanoimprinting). The layer thicknesses of the M, n, i and p layers are typically from 10 to 1000 nm, preferably from 10 to 400 nm.

The substrates used are, for example, glass, metal foils or polymer films which are generally coated with a transparent conductive layer (for example $SnO_2$:F, $SnO_2$:In, ZnO:Al, carbon nanotubes, thin metal layers).

In addition to the compounds of the general formula (I), the following semiconductor materials are suitable for use in organic photovoltaics:

Phthalocyanines, such as hexadecachlorophthalocyanines and hexadecafluorophthalocyanines, metal-free phthalocyanines and phthalocyanines comprising divalent metals or metal atom-containing groups, especially those of titanyloxy, vanadyloxy, iron, copper, zinc, etc. Suitable phthalocyanines are especially copper phthalocyanine, zinc phthalocyanine, metal-free phthalocyanine, copper hexadecachlorophthalocyanine, zinc hexadecachlorophthalocyanine, metal-free hexadecachlorophthalocyanine, copper hexadecafluorophthalocyanine, hexadecafluorophthalocyanine or metal-free hexadecafluorophthalocyanine.

Porphyrins, for example 5, 10,15,20-tetra(3-pyridyl)porphyrin (TpyP), or else tetrabenzoporphyrins, for example metal-free tetrabenzoporphyrin, copper tetrabenzoporphyrin or zinc tetrabenzoporphyrin.

Liquid-crystalline (LC) materials, for example coronenes, such as hexabenzocoronene (HBC-PhC12), coronenediimides, or triphenylenes such as 2,3,6,7,10,11-hexahexylthiotriphenylene ($HTT_6$), 2,3,6,7,10,11-hexakis(4-n-nonylphenyl)triphenylene ($PTP_9$) or 2,3,6,7,10,11-hexakis(undecyloxy)triphenylene ($HAT_{11}$). Particular preference is given to liquid-crystalline materials which are discotic.

Thiophenes, oligothiophenes and substituted derivatives thereof. Suitable oligothiophenes are quaterthiophenes, quinquethiophenes, sexithiophenes, $\alpha,\omega$-di($C_1$-$C_8$)alkyloligothiophenes such as $\alpha,\omega$-dihexylquaterthiophenes, $\alpha,\omega$-dihexyl-quinquethiophenes and $\alpha,\omega$-dihexylsexithiophenes, poly(alkylthiophenes) such as poly(3-hexylthiophene), bis (dithienothiophenes), anthradithiophenes and dialkylanthradithiophenes such as dihexylanthradithiophene, phenylene-thiophene (P-T) oligomers and derivatives thereof, especially $\alpha,\omega$-alkyl-substituted phenylene-thiophene oligomers.

Also suitable are compounds of the $\alpha,\alpha'$-bis(2,2-dicyanovinyl)quinquethiophene ($DCV_5T$) type, poly[3-(4-octylphenyl)-2,2'-bithiophene] (PTOPT), poly(3-(4'-(1,4,7-trioxaoctyl)phenyl)thiophene) (PEOPT), poly(3-(2'-methoxy-5'-octylphenyl)thiophene) (POMeOPT), poly(3-octylthiophene) (P3OT), poly(pyridopyrazinevinylene)-polythiophene blends such as EHH-PpyPz, PTPTB copolymers, BBL, poly(9,9-dioctyl-fluorene-co-bis-N,N'-(4-methoxyphenyl)bis-N,N'-phenyl-1,4-phenylenediamine) (PFMO); see Brabec C., Adv. Mater., 2996, 18, 2884, (PCP-DTBT) poly[2,6-(4,4-bis(2-ethylhexyl)-4H-cyclopenta[2,1-b; 3,4-b']-dithiophene)-4,7-(2,1,3-benzothiadiazole);

Paraphenylenevinylene and paraphenylenevinylene-comprising oligomers and polymers, for example polyparaphenylenevinylene (PPV), MEH-PPV (poly(2-methoxy-5-(2'-ethylhexyloxy)-1,4-phenylenevinylene)), MDMO-PPV (poly(2-methoxy-5-(3',7'-dimethyloctyloxy)-1,4-phenylenevinylene)), cyano-paraphenylenevinylene (CN-PPV), CN-PPV modified with various alkoxy groups;

Phenyleneethynylene/phenylenevinylene hybrid polymers (PPE-PPV).

Polyfluorenes and alternating polyfluorene copolymers, for example with 4,7-dithien-2'-yl-2,1,3-benzothiadiazole. Also suitable are poly(9,9'-dioctylfluorene-co-benzothiadiazole) ($F_8BT$), poly(9,9'-dioctylfluorene-co-bis(N,N'-(4-butylphenyl))-bis(N,N'-phenyl)-1,4-phenylenediamine (PFB).

Polycarbazoles, i.e. carbazole-comprising oligomers and polymers, such as (2,7) and (3,6).

Polyanilines, i.e. aniline-comprising oligomers and polymers.

Triarylamines, polytriarylamines, polycyclopentadienes, polypyrroles, polyfurans, polysiloles, polyphospholes, N,N'-bis(3-methylphenyl)-N,N'-bis(phenyl)benzidine (TPD), 4,4'-bis(carbazol-9-yl)biphenyl (CBP), 2,2',7,7'-tetrakis-(N,N-di-p-methoxyphenyl-amine)-9,9'-spirobifluorene (Spiro-MeOTAD).

Fullerenes, especially C60 and derivatives thereof such as PCBM (=[6,6]-phenyl-$C_{61}$-butyric acid methyl ester). In such case, the fullerene derivative is a hole conductor.

All aforementioned semiconductor materials may also be doped. Examples of suitable dopants for n-semiconductors are, for example, the compounds of the formula (I), rhodamine or pyronin B. Examples of suitable dopants for p-semiconductors are 2,3,5,6-tetrafluoro-7,7,8,8-tetracyanoquinodimethane ($F_4$-TCNQ).

The invention further provides an organic light-emitting diode (OLED) which comprises at least one compound of the general formula (I) as defined above. The compounds of the formula (I) may serve as a charge transport material (electron conductor).

Organic light-emitting diodes are in principle constructed from several layers. These include 1. anode 2. hole-transporting layer 3. light-emitting layer 4. electron-transporting layer 5. cathode. It is also possible that the organic light-emitting diode does not have all of the layers mentioned; for example, an organic light-emitting diode with the layers (1) (anode), (3) (light-emitting layer) and (5) (cathode) is likewise suitable, in which case the functions of the layers (2) (hole-transporting layer) and (4) (electron-transporting layer) are assumed by the adjacent layers. OLEDs which have the layers (1), (2), (3) and (5) or the layers (1), (3), (4) and (5) are likewise suitable. The structure of organic light-emitting diodes and processes for their production are known in principle to those skilled in the art, for example from WO 2005/019373. Suitable materials for the individual layers of OLEDs are disclosed, for example, in WO 00/70655. Reference is made here to the disclosure of these documents. Inventive OLEDs can be produced by methods known to those skilled in the art. In general, an OLED is produced by successive vapor deposition of the individual layers onto a suitable substrate. Suitable substrates are, for example, glass or polymer films. For vapor deposition, it is possible to use customary techniques such as thermal evaporation, chemical vapor deposition and others. In an alternative process, the organic layers may be coated from solutions or dispersions in suitable solvents, for which coating techniques known to those skilled in the art are employed. Compositions which, as well as a compound of the general formula (I) have a polymeric material in one of the layers of the OLED, preferably in the light-emitting layer, are generally applied as a layer by processing from solution.

As a result of the inventive use of the compounds (I), it is possible to obtain OLEDs with high efficiency. The inventive OLEDs can be used in all devices in which electroluminescence is useful. Suitable devices are preferably selected from stationary and mobile visual display units. Stationary visual display units are, for example, visual display units of computers, televisions, visual display units in printers, kitchen appliances and advertising panels, illuminations and information panels. Mobile visual display units are, for example, visual display units in cellphones, laptops, digital cameras, vehicles and destination displays on buses and trains. Moreover, the compounds (I) may be used in OLEDs with inverse structure. The compounds (I) in these inverse OLEDs are in turn preferably used in the light-emitting layer. The structure of inverse OLEDs and the materials typically used therein are known to those skilled in the art.

Before they are used as charge transport materials or exciton transport materials, it may be advisable to subject the compounds of the formula (I) to a purification process. Suitable purification processes comprise conversion of the compounds of the formula (I) to the gas phase. This includes purification by sublimation or PVD (physical vapor deposition). Preference is given to a fractional sublimation. For fractional sublimation and/or deposition of the compound, a temperature gradient is used. Preference is given to subliming the compound of the formula (I) with heating in a carrier gas stream. The carrier gas then flows through a separating chamber. A suitable separating chamber has at least two different separating zones with different temperatures. Preference is given to using a three-zone furnace. A suitable process and an apparatus for fractional sublimation is described in U.S. Pat. No. 4,036,594.

The invention further provides a process for depositing at least one compound of the formula (I) onto or applying at least one compound of the formula (I) to a substrate by a gas phase deposition process or a wet application process.

The invention is illustrated in detail with reference to the following nonrestrictive examples.

EXAMPLES

Synthesis Examples

Example 1

Preparation of octafluoro-N,N'-dimethylperylene-3,4:9,10-tetracarboximide 1.a) Preparation of octachloro-N,N'-dimethylperylene-3,4:9,10-tetracarboximide

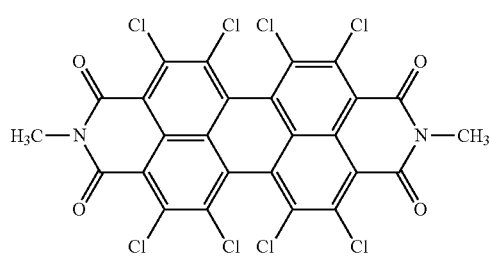

To a solution of N,N'-dimethylperylene-3,4:9,10-tetracarboximide (20.9 g, 0.05 mol) in chlorosulfonic acid (200 g) was introduced, at 80° C. over a period of 28 hours, chlorine (approx. 500 g). Over this period, iodine (10 g) was added in portions. The resulting reaction mixture was cooled and added to ice-water. The solid which precipitated out was filtered off and washed until the filtrate was pH-neutral. After drying under reduced pressure, octachloro-N,N'-dimethylperylene-3,4:9,10-tetracarboximide was obtained as an orange solid (28.8 g; 83% yield).

The compound was purified further by recrystallization from toluene. To this end, 4.0 g of the crude product in toluene (1.1 l) were heated under reflux and cooled to 0° C. for several days. The precipitated solid was filtered off and dried under reduced pressure. This afforded 3.21 g of the purified compound.

1.b) Preparation of octafluoro-N,N-dimethylperylene-3,4:9,10-tetracarboximide

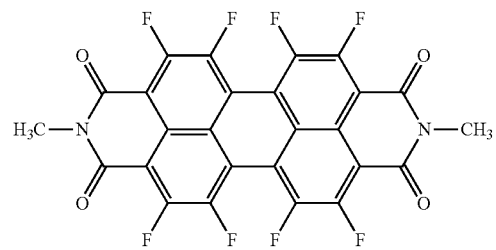

To a mixture of sulfolane (250 ml), 18-crown-6 ether (11.4 g, 43.2 mmol) and potassium fluoride (7.3 g, 125 mmol) was added, at 180° C., N,N'-dimethyl-octachloroperylene-3,4:9,10-tetracarboximide (3.1 g, 5 mmol). The reaction mixture was stirred at this temperature for one further hour. After cooling to room temperature, demineralized water was added. The solid which precipitated out was filtered off and washed with demineralized water and dried. The resulting product was purified by column chromatography (SiO$_2$, toluene/ethyl acetate, 10:1). Octafluoro-N,N-dimethylperylene-3,4:9,10-tetracarboximide was obtained as a brownish-yellow solid in an amount of 45 mg (1.5% yield).

$R_f$ (toluene/ethyl acetate; 10:1)=0.19.

$\lambda_{max\ emission}$ (high dilution, CH$_2$Cl$_2$)=481 nm, 515 nm $\lambda_{max\ absorption}$ (CH$_2$Cl$_2$)=approx. 408 nm (20.9 l/g cm), 435 nm (47.9 l/g cm), 466 nm (approx. 65.8 l/g cm)

1.c) Alternative route to the preparation of octafluoro-N,N-dimethylperylene-3,4:9,10-tetracarboximide To a mixture of 166 ml of o-xylene, 1.7 g (6.7 mmol) of (N,N'-dimethylimidazolidino)-tetramethylguanidinium chloride and 30.0 g (533 mmol) of potassium fluoride were added 4.63 g (6.7 mmol) of octachloro-N,N'-dimethylperylene-3,4:9,10-tetracarboximide from example 1a. The reaction mixture was heated at reflux for 30 minutes. Thereafter, the reaction mixture was allowed to cool to room temperature and the product was isolated directly from the reaction mixture by column chromatography on 180 g of silica gel using petroleum ether and dichloromethane. After repeated chromatography, 1.55 g (41%) of the title compound were obtained with a purity of 98%, and 0.6 g (16%) of the title compound with a purity of 94%.

The title compound was obtained in very high purity by repeated chromatography with a flow rate of 101 l/g with UV/VIS detection at 469 nm.

Example 2

Preparation of octachloroperylene-3,4:9,10-tetracarboximide

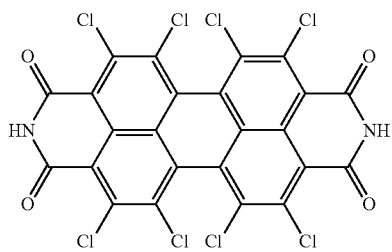 [SMILES: O=C1NC(=O)c2c(Cl)c(Cl)c3c4c(Cl)c(Cl)c5c6c(c(Cl)c(Cl)c(c7c(Cl)c(Cl)c1c2c73)c64)C(=O)NC5=O]

To a solution of perylene-3,4:9,10-tetracarboximide (19.5 g, 0.05 mol) in chlorosulfonic acid (200 g) was added iodine (2.0 g). The reaction mixture was heated to 80° C. Over a period of 25 hours, chlorine (approx. 445 g) was introduced. After cooling to room temperature, the reaction mixture was added to ice. The solid which precipitated out was filtered off and washed repeatedly with water. After drying under reduced pressure, octachloro-N,N'-dihydroperylene-3,4:9, 10-tetracarboximide was obtained as an orange solid in an amount of 26.14 g (79% yield).

The product was purified further by recrystallization. To this end, 4.0 g of the crude product were dissolved in N-methylpyrrolidone (NMP, 70 ml) at 140° C., and the mixture was cooled slowly to room temperature. The precipitate was isolated by filtration, washed with petroleum ether and dried under reduced pressure. Subsequently, the residue was taken up in acetic acid for several days and stirred under reflux conditions. After another filtration and drying, 0.81 g of purified octachloro-N,N'-dihydroperylene-3,4:9,10-tetracarboximide was obtained (chlorine content: 42.7% (theor.: 42.6%)).

Example 3

Preparation of perchloroperylene-3,4:9,10-tetracarboxylic dianhydride

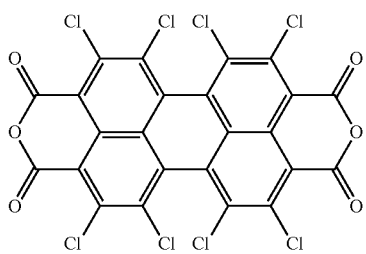 [SMILES: O=C1OC(=O)c2c(Cl)c(Cl)c3c4c(Cl)c(Cl)c5c6c(c(Cl)c(Cl)c(c7c(Cl)c(Cl)c1c2c73)c64)C(=O)OC5=O]

To a solution of perylene-3,4:9,10-tetracarboxylic anhydride (20.0 g) in chlorosulfonic acid (200 g) was added iodine (1.0 g). The reaction mixture was heated to 60° C. Over a period of 7 hours, chlorine (approx. 120 g) was introduced. Subsequently, iodine (1.0 g) was added again, the mixture was heated to 80° C. and further chlorine was introduced over a period of 5 hours. After cooling to room temperature, the reaction mixture was poured onto ice-water. The solid which precipitated out was filtered off and washed until the filtrate was pH-neutral. After drying under reduced pressure, octachloroperylene-3,4:9,10-tetracarboxylic anhydride was obtained as an orange solid (29.8 g; 89% yield).

Example 4

Preparation of Compounds (4.a) and (4.b)

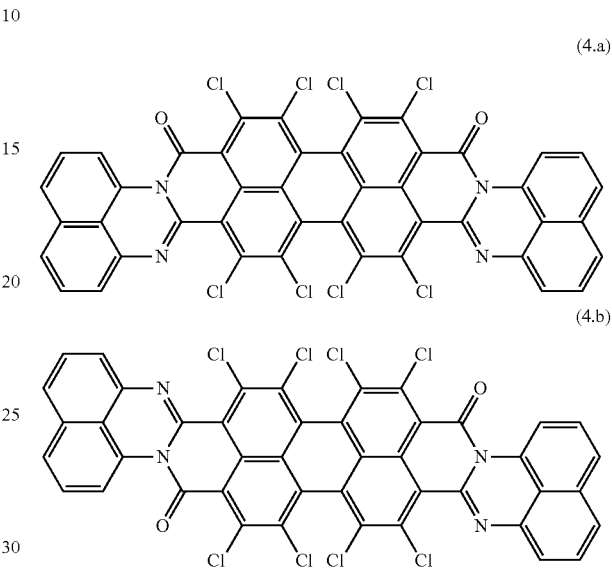

A mixture of 1,8-diaminonapthalene (1.78 g, 11.25 mmol), pyrazine (0.9 g, 11.25 mmol) and perchloroperylene-3,4:9, 10-tetracarboxylic anhydride (3.0 g, 4.5 mmol) in phenol (50 g) was stirred at a temperature of 120° C. for 36 hours. Subsequently, the reaction mixture was cooled to room temperature and admixed with methanol. The solid was filtered off, washed repeatedly with methanol and dilute hydrochloric acid and then dried. A mixture of the compounds (4.a) and (4.b) was obtained as a black solid in an amount of 3.97 g (quantitative yield).

Example 5

Preparation of octachloro-N,N'-bis(2,6-diisopropylphenyl)perylene-3,4:9,10-tetracarboximide

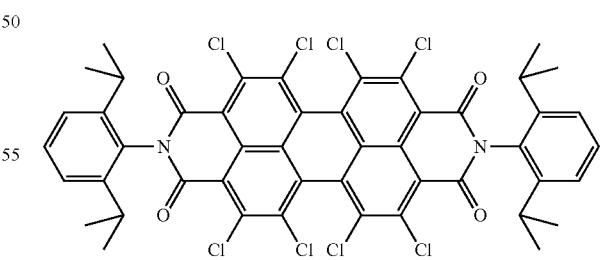

A mixture of octachloroperylene-3,4:9,10-tetracarboxylic dianhydride (1.0 g, 1.5 mmol) and 2,6-diisopropylaniline (6 mmol) in propionic acid (16 ml) was stirred at a temperature of 100° C. for 5 hours. After cooling to room temperature, the reaction mixture was admixed with water. The solid which precipitated out was filtered off and dried under reduced pressure. The crude product thus obtained was purified by column chromatography (SiO$_2$, dichloromethane). Octachloro-N,N'-bis(2,6-diisopropyl-phenyl)perylene-3,4: 9,10-tetracarboximide was obtained as an orange solid in an amount of 0.6 g (40% yield). R$_f$(SiO$_2$, toluene/ethyl acetate, 10:1)=0.86.

Example 6

Preparation of octachloro-N,N'-bis(1H,1H-perfluorobutyl)perylene-3,4:9,10-tetracarboximide 6.a) Preparation of N,N'-bis(1H,1H-perfluorobutyl)-1,6,7,12-tetrachloroperylene-3,4:9,10-tetracarboximide (not inventive)

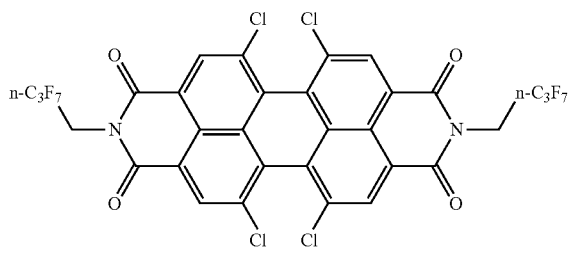

A mixture of 1,6,7,12-tetrachloroperylene-3,4:9,10-tetracarboxylic dianhydride (9.38 g, 17.7 mmol) and 1H,1H-heptafluoro-n-butylamine (9.88 g, 49.6 mmol) in N-methylpyrrolidone (NMP, 100 ml) and acetic acid (6.4 g, 106 mmol) was stirred at a temperature of 90° C. for 5 h. After cooling to room temperature, the reaction mixture was added to dilute hydrochloric acid (250 ml). The solid which precipitated out was filtered off, washed with water until the filtrate was pH-neutral and dried under reduced pressure. This afforded an orange solid (14.3 g), which was purified by column chromatography (SiO$_2$, toluene/acetone).

N,N'-bis(1H,1H-perfluorobutyl)-1,6,7,12-tetrachloroperylene-3,4:9,10-tetracarboximide was obtained as a product mixture with the corresponding trichlorinated perylene, as an orange solid, in an amount of 12.83 g (81% yield). R$_f$(toluene)=0.39.

6.b) Preparation of octachloro-N,N'-bis(1H,1H-perfluorobutyl)perylene-3,4:9,10-tetracarboximide

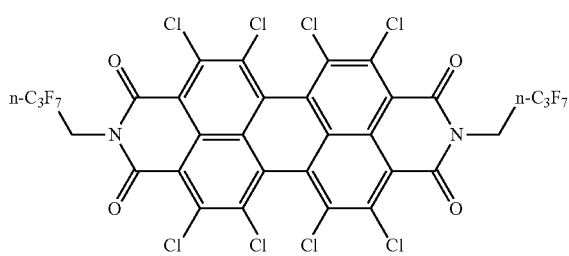

The product mixture obtained under 6.a) (19.0 g, 21 mmol) in chlorosulfonic acid (200 g) was admixed with iodine (1.0 g) and heated. At a temperature of 60° C., an excess of chlorine was introduced into the reaction mixture at standard pressure over a period of 7 hours. Over this period, further iodine (1.0 g) was added in portions. After cooling to room temperature, the reaction mixture was added to ice. The solid which precipitated out was filtered off and washed with water. This afforded 21.8 g (quant. yield) of a toluene-soluble, orange solid (chlorine content: 28.3% (theor.: 27.5%)).

Example 7

Preparation of tetrachlorotetrafluoro-N,N-dimethylperylene-3,4:9,10-tetracarboximide To a mixture of 150 ml of ortho-xylene, 0.75 g (3 mmol) of (N,N'-dimethylimidazolidino)-tetramethylguanidinium chloride and 14.0 g (240 mmol) of potassium fluoride were added 2.08 g (3 mmol) of octachloro-N,N'-dimethylperylene-3,4:9,10-tetracarboximide from example 1.a, and the reaction mixture was heated to 80° C. The mixture was stirred at this temperature for four hours and then cooled to room temperature. The reaction mixture was added directly to a frit filled with silica gel, and the xylene was washed out with petroleum ether. Subsequently, the product was eluted with 10:1 methylene chloride/tert-butyl methyl ether to obtain 0.62 g (53%) of a brownish solid.

Example 8

Preparation of octafluoro-N,N'-bis(1H,1H-perfluorobutyl)perylene-3,4:9,10-tetracarboximide

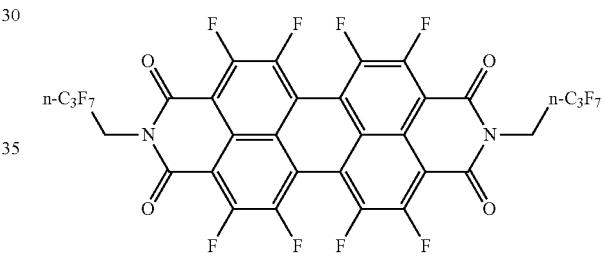

To a mixture of 70 ml of dry xylene, 1.06 g (4 mmol) of 18-crown-6 and 4.65 g (80 mmol) of potassium fluoride was added 0.515 g (0.5 mmol) of octachloro-N,N'-bis(1H,1H-perfluorobutyl)perylene-3,4:9,10-tetracarboximide (compound from example 6.b) at 40° C. After stirring at this temperature for 1.5 hours, the mixture was heated to 80° C., stirred at this temperature for 30 minutes, then heated to 120° C. and stirred at this temperature for 30 minutes, before heating to reflux temperature. The reaction mixture was heated under reflux for two hours. Thereafter, the reaction mixture was cooled and filtered, the residue was washed with toluene and the filtrate was concentrated. The product was purified by chromatography with dichloromethane to obtain 79 mg (18%) of a brownish powder. R$_f$ (dichloromethane) =0.28; MALDI-MS: M−=897.898:

Example 9

Preparation of tetrachlorotetrafluoro-N,N'-bis(1H, 1H-perfluorobutyl)-perylene-3,4:9,10-tetracarboximide To a mixture of 100 ml of anhydrous xylene, 0.25 g (1 mmol) of (N,N'-dimethyl-imidazolidino)tetramethylguanidinium chloride and 4.65 g (80 mmol) of potassium fluoride were added 1.03 g of octafluoro-N,N-dimethylperylene-3,4; 9,10-tetracarboximide (compound from example 6.b). The reaction mixture was heated to 120° C. and kept at this temperature for 30 minutes. After cooling to room temperature, potassium fluoride was filtered off and washed with dichloromethane and petroleum ether. The resulting solution was purified by chromatography on silica gel using petroleum ether and tert-butyl methyl ether.
R$_f$(CH$_2$Cl$_2$)=0.49;
MALDI-MS: M–=961.8 g/mol.

Example 10

Preparation of octafluoro-N,N'-(2,6-diisopropylphenyl)perylene-3,4:9,10-tetracarboximide

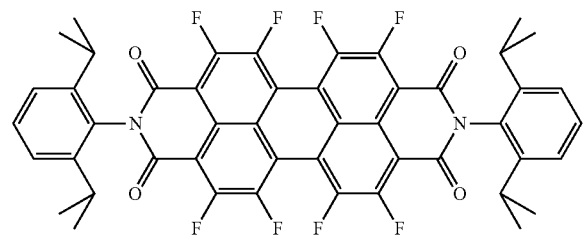 [SMILES: CC(C)c1cccc(C(C)C)c1N1C(=O)c2c(F)c(F)c3c4c(F)c(F)c5c6c(c(F)c(F)c(c7c(F)c(F)c(c2c37)C1=O)c64)C(=O)N(c1c(C(C)C)cccc1C(C)C)C5=O]

To a mixture of 35 ml of o-xylene, 0.25 g (1 mmol) of (N,N'-dimethylimidazolidino)tetramethylguanidinium chloride and 4.5 g (80 mmol) of potassium fluoride was added 1.0 g (1.02 mmol) of octachloro-N,N'-bis(2,6-diisopropylphenyl)perylene-3,4:9,10-tetracarboximide (compound from example 5). The reaction mixture was heated at reflux for one hour, then cooled and purified by chromatography on toluene. R$_f$(toluene:ethyl acetate 10:1)=0.6.

Example 11

Preparation of N,N'-bis(3,5-trifluoromethylphenyl)perchloroperylene-3,4:9,10-tetracarboximide 11.a: Preparation of N,N'-bis(3,5-trifluoromethylphenyl)-1,6,7,12-tetrachloroperylene-3,4:9,10-tetracarboximide (noninventive)

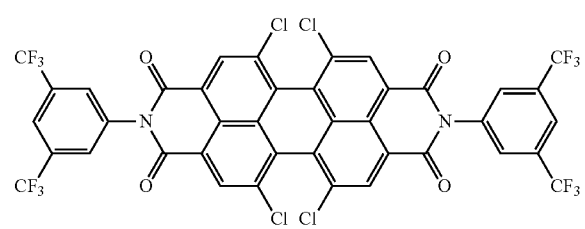 [SMILES: O=C1c2cc(Cl)c3c4c(Cl)cc5c6c(cc(Cl)c(c7c(Cl)cc(c2c37)C(=O)N1c1cc(C(F)(F)F)cc(C(F)(F)F)c1)c64)C(=O)N(c1cc(C(F)(F)F)cc(C(F)(F)F)c1)C5=O]

A mixture of 10.6 g (20 mmol) of 1,6,7,12-tetrachloroperylene-3,4:9,10-tetracarboxylic dianhydride, 100 ml of NMP, 12.8 g (56 mmol) of 3,5-bis(trifluoromethyl)aniline and 7.2 g (120 mmol) of acetic acid was heated to 90° C. for approx. 70 hours. The reaction mixture was allowed to cool and then poured onto 1000 ml of dilute hydrochloric acid, and the precipitate was filtered off, washed with water and dried under reduced pressure. The product was purified by chromatography on silica gel using a mixture of toluene and petroleum ether employing a concentration gradient. This gave 8.52 g (45%) of an orange powder.
R$_f$(1:1 toluene:dichloromethane)=0.67

11.b: Preparation of N,N'-bis(3,5-trifluoromethylphenyl)perchloroperylene-3,4:9,10-tetracarboximide

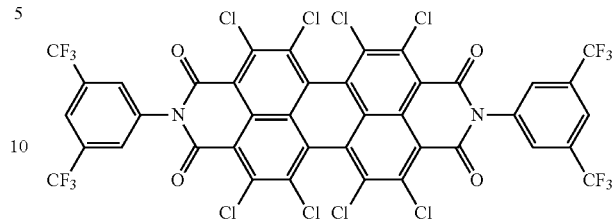

A mixture of 7.9 g of the compound from 11.a, 95.0 g (55 ml) of chlorosulfonic acid and 0.5 g of iodine was heated to 60° C. 53.0 g of chlorine were introduced under the surface of the mixture and the mixture was stirred at 60° C. for 3 hours and at room temperature for 48 hours. The mixture was poured onto ice, filtered and washed to neutrality with water. This gave 7.3 g of an orange crude product. 3.0 g of the crude product were purified by column chromatography (column with a diameter of 6.5 cm) on 180 g of silica gel using 1.5:1 petroleum ether/dichloromethane. This gave 0.93 g of pure title compound. R$_f$(toluene)=0.61

Example 12

Preparation of N,N'-bis(1,H, 1'H, 2H, 2'H-perfluorodecyl)octachloroperylene-3,4:9,10-tetracarboximide 12.a: Preparation of N,N'-bis(1,H,1'H, 2H,2'H-perfluorodecyl)-1,6,7,12-tetrachloroperylene-3,4:9,10-tetracarboximide (noninventive)

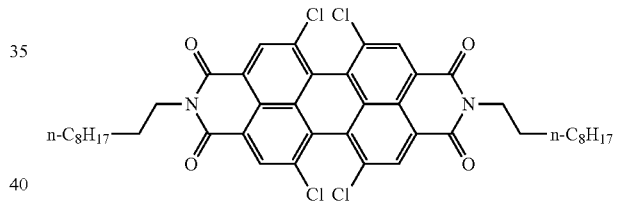

The compound was prepared analogously to the process in example 6.a.

12.b: Preparation of N,N'-bis(1,H, 1'H, 2H, 2'H-perfluorodecyl)octachloroperylene-3,4:9,10-tetracarboximide

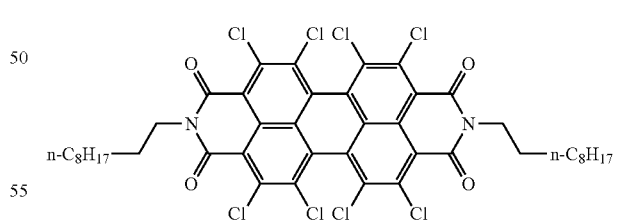

The chlorination was effected analogously to example 11.b, except that a total of 212 g of chlorine were introduced in portions at 60° C. over a period of four days. The reaction mixture was added to ice-water, filtered, washed to neutrality with water and dried under reduced pressure. 6.0 g of an orange crude product were purified by column chromatography (column with a diameter of 6.5 cm) on 180 g of silica gel with 1:1 toluene/petroleum ether. This gave 3.8 g of pure title compound. R$_f$(toluene)=0.72.

The compounds of examples 13 and 14 were prepared in an analogous manner.

Example 13

Preparation of octachloro-N,N'-bis(1H,1H-perfluorooctyl)perylene-3,4:9,10-tetracarboximide

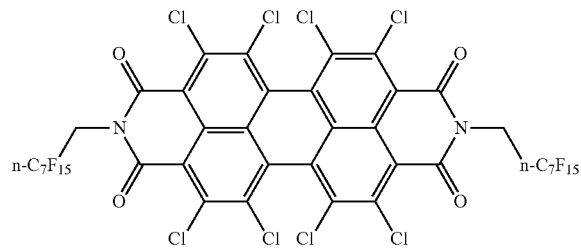

Example 14

Preparation of octafluoro-N,N'-bis(1H,1H-perfluorooctyl)perylene-3,4:9,10-tetracarboximide

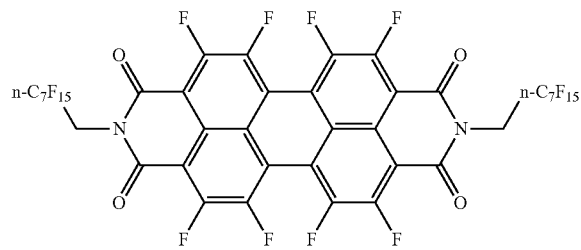

General Method for Determining the Field-Effect Transistor Characteristics

1. Production of Semiconductor Substrates by Means of Physical Vapor Deposition (PVD)

The substrates used were high-doping n-type (100 nm) silicon wafers (conductivity<0.004 $\Omega^{-1}$ cm) with a thermally deposited oxide layer (300 nm) as the gate dielectric (area-based capacitance $C_i$=10 nF/cm$^2$). The coated substrates were cleaned by rinsing with acetone and isopropanol. The semiconductor compounds were applied by vapor deposition under reduced pressure at defined deposition temperatures between 25 and 150° C. (typically at 125° C.), and deposited on the substrate with a deposition rate in the range from 0.3 to 0.5 Å/s and a pressure of $10^{-6}$ Torr in a vacuum coating apparatus (Angstrom Engineering Inc., Canada). To measure the charge mobilities of the resulting material, TFTs were provided in top-contact configuration. To this end, source and drain electrodes of gold (typically of channel length 100 µm and length/width ratio about 20) were deposited through a shadowmask by means of gas phase deposition. The electrical properties of the TFTs were determined by means of a Keithley 4200-SCS semiconductor parameter analyzer.

2. Surface Treatment a) OTS-V

After the cleaning of the SiO$_2$-coated wafers by rinsing with acetone and isopropanol, the surface can additionally be modified, for example, with n-octadecyltriethoxysilane (OTS, C$_{18}$H$_{37}$Si(OC$_2$H$_5$)$_3$). To this end, a few drops of OTS (Aldrich Chem. Co.) were placed onto the preheated surface (about 100° C.) in a vacuum desiccator. The desiccator was evacuated and the substrates were kept under reduced pressure (25 mm Hg) for at least 5 hours. Finally, the substrates were baked at 110° C. for 15 minutes, rinsed with isopropanol and dried in a nitrogen stream.

B) Unmodified Surface

The SiO$_2$/Si substrates were rinsed with toluene, acetone and isopropanol, and dried in a nitrogen stream. The cleaned wafers were used without further surface modification.

3. Purification

The compounds are purified by three-zone gradient sublimation.

Example 15

Field-Effect Transistor Comprising the Compound from Example 2

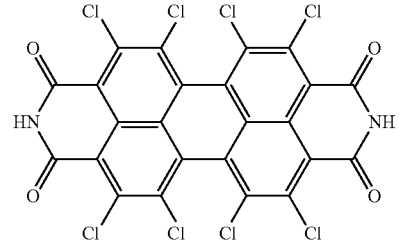 [SMILES: O=C1NC(=O)c2c(Cl)c(Cl)c3c4c(Cl)c(Cl)c5c6c(c(Cl)c(Cl)c(c7c(Cl)c(Cl)c1c2c73)c64)C(=O)NC5=O]

The compound was deposited at 125° C. The component was analyzed both under nitrogen and in an air atmosphere. The results are listed in table 1.

TABLE 1

| Surface treatment | | N$_2$ | Air*) |
|---|---|---|---|
| with OTS-V | mobility µ (cm$^2$/Vs) | 0.27 | 0.20 |
| | $I_{on}/I_{off}$ | 1.4 × 10$^5$ | 1.5 × 10$^7$ |
| | $V_t$(V) | 22.0 | 30.2 |
| without surface treatment | mobility µ (cm$^2$/Vs) | 2.9 × 10$^{-5}$ | n.d. |
| | $I_{on}/I_{off}$ | 1.3 × 10$^3$ | n.d. |
| | $V_t$(V) | 16.2 | n.d. |

*)relative air humidity: about 42%
n.d. not determined

Example 16

Field-Effect Transistor Comprising the Compound from Example 6.b

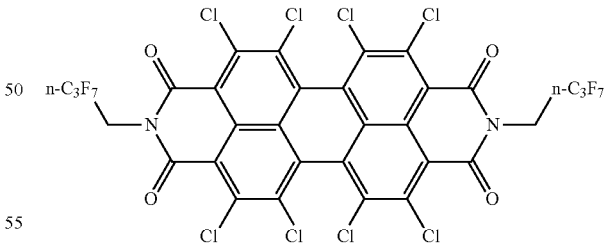

The compound was deposited at 125° C. The component was analyzed both under nitrogen and in an air atmosphere. The results are listed in table 2.

TABLE 2

| Surface treatment | | N$_2$ | Air*) |
|---|---|---|---|
| with OTS-V | mobility µ (cm$^2$/Vs) | 0.060 | 0.044 |
| | $I_{on}/I_{off}$ | 20.3 | 28.4 |
| | $V_t$(V) | 1.2 × 10$^3$ | 1.8 × 10$^3$ |

TABLE 2-continued

| Surface treatment | | $N_2$ | Air*) |
|---|---|---|---|
| without surface treatment | mobility μ (cm²/Vs) | $2.0 \times 10^{-5}$ | n.d. |
| | $I_{on}/I_{off}$ | $7.2 \times 10^2$ | n.d. |
| | $V_t$ (V) | 17.9 | n.d. |

*) relative air humidity: about 42%
n.d. not determined

Example 17

Field-Effect Transistor Comprising the Compound from Example 3

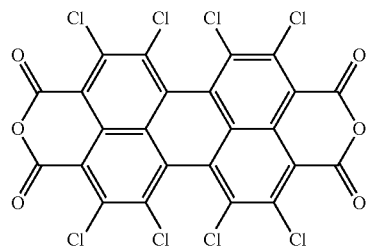 [SMILES: O=C1OC(=O)c2c(Cl)c(Cl)c3c4c(Cl)c(Cl)c5c6c(c(Cl)c(Cl)c(c7c(Cl)c(Cl)c1c2c73)c64)C(=O)OC5=O]

The compound was deposited at 125° C. The component was analyzed both under nitrogen and in an air atmosphere. The results are listed in table 3.

TABLE 3

| Surface treatment | | $N_2$ | Air*) |
|---|---|---|---|
| with OTS-V | mobility μ (cm²/Vs) | $1.1 \times 10^{-5}$ | $3.9 \times 10^{-6}$ |
| | $I_{on}/I_{off}$ | $3.9 \times 10^2$ | $1.4 \times 10^3$ |
| | $V_t$ (V) | 26.6 | 34.9 |

*) relative air humidity: about 42%

The invention claimed is:

1. A method of transporting a charge, the method comprising:

conducting an electron through a material comprising a compound of formula (I.Ba):

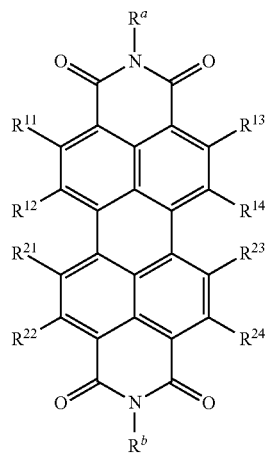

(I.Ba)

wherein
$R^a$ represents an unsubstituted or substituted cycloalkyl group; an unsubstituted or substituted aryl group; a 2,2,3,3,3-pentafluoropropyl group; a 2,2-difluoroethyl group; a 2,2,3,3,4,4,4-heptafluorobutyl group; a 2,2,3,3,3-pentafluoropropyl group; a 1H,1H-pentadecafluorooctyl group; a 3-bromo-3,3-difluoropropyl group; a 3,3,3-trifluoropropyl group; a 1H,1H,2H,2H-perfluorodecyl group; a 3-(perfluorooctyl)propyl group; a 4,4-difluorobutyl group; a 4,4,4-trifluorobutyl group; a 5,5,6,6,6-pentafluorohexyl group; a 2,2-difluoropropyl group; a 2,2,2-trifluoroethyl group, or a 2-bromo-2,2-difluoroethyl group;

$R^b$ represents an unsubstituted or substituted cycloalkyl group; an unsubstituted or substituted aryl group; a 2,2,3,3,3-pentafluoropropyl group; a 2,2-difluoroethyl group; a 2,2,3,3,4,4,4-heptafluorobutyl group; a 2,2,3,3,3-pentafluoropropyl group; a 1H,1H-pentadecafluorooctyl group; a 3-bromo-3,3-difluoropropyl group; a 3,3,3-trifluoropropyl group; a 1H,1H,2H,2H-perfluorodecyl group; a 3-(perfluorooctyl)propyl group; a 4,4-difluorobutyl group; a 4,4,4-trifluorobutyl group; a 5,5,6,6,6-pentafluorohexyl group; a 2,2-difluoropropyl group; a 2,2,2-trifluoroethyl group, or a 2-bromo-2,2-difluoroethyl group;

and each of $R^{11}$, $R^{12}$, $R^{13}$, $R^{14}$, $R^{21}$, $R^{22}$, $R^{23}$, and $R^{24}$, individually, represents chlorine or fluorine.

2. The method according to claim 1, wherein each of $R^{11}$, $R^{12}$, $R^{13}$, $R^{14}$, $R^{21}$, $R^{22}$, $R^{23}$, and $R^{24}$ represents chlorine.

3. The method according to claim 1, wherein each of $R^{11}$, $R^{12}$, $R^{13}$, $R^{14}$, $R^{21}$, $R^{22}$, $R^{23}$, and $R^{24}$ represents fluorine.

4. The method according to claim 1, wherein $R^a$ represents an unsubstituted or substituted cycloalkyl group.

5. The method according to claim 1, wherein $R^a$ represents an unsubstituted or substituted aryl group.

6. The method according to claim 1, wherein $R^a$ and $R^b$ represent the same group.

7. The method according to claim 1, wherein each of $R^a$ and $R^b$ represents an unsubstituted or substituted aryl group.

8. The method according to claim 1, wherein the compound of formula (I.Ba) is selected from the group consisting of

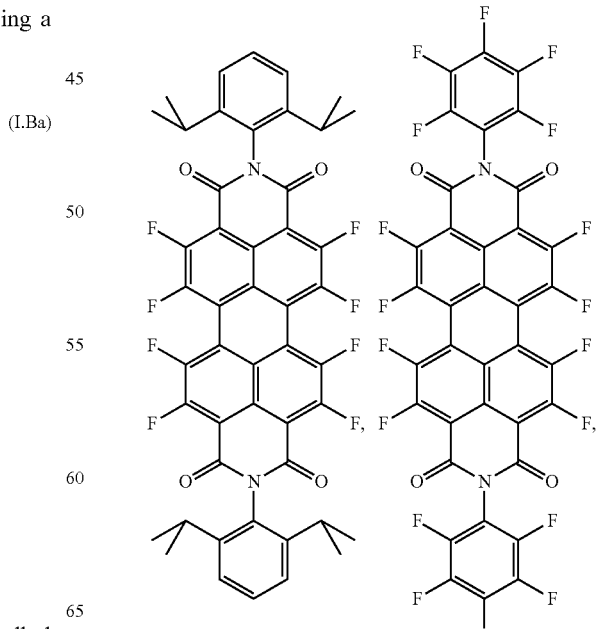

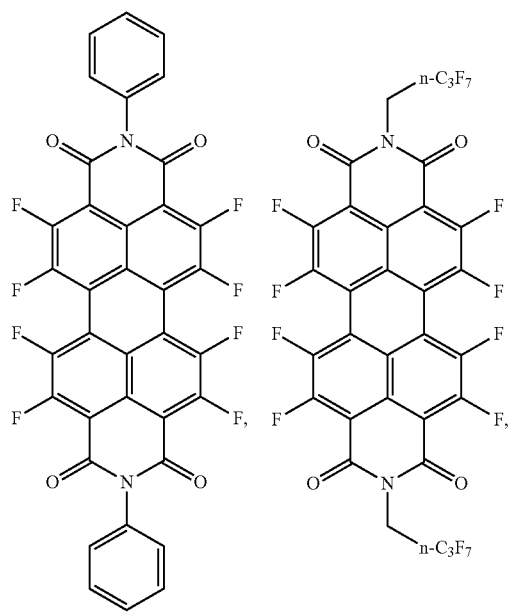
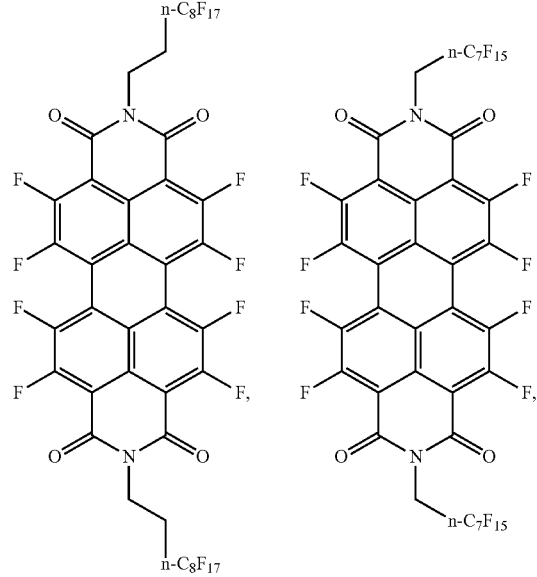
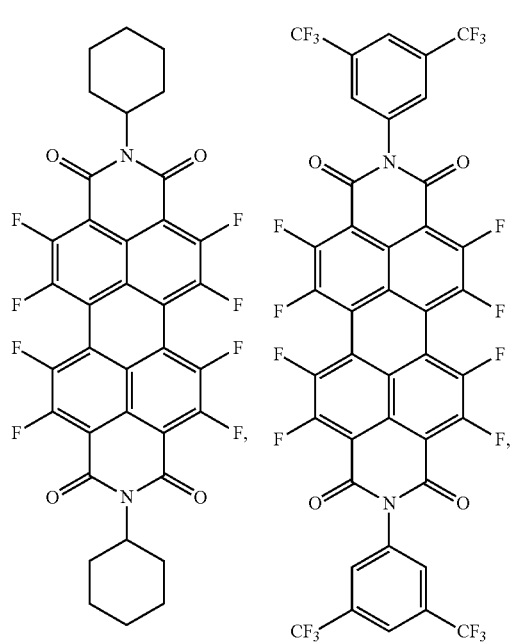
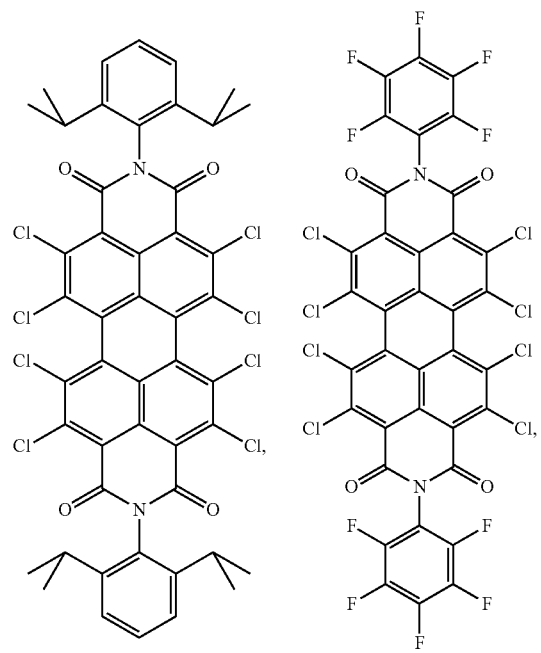

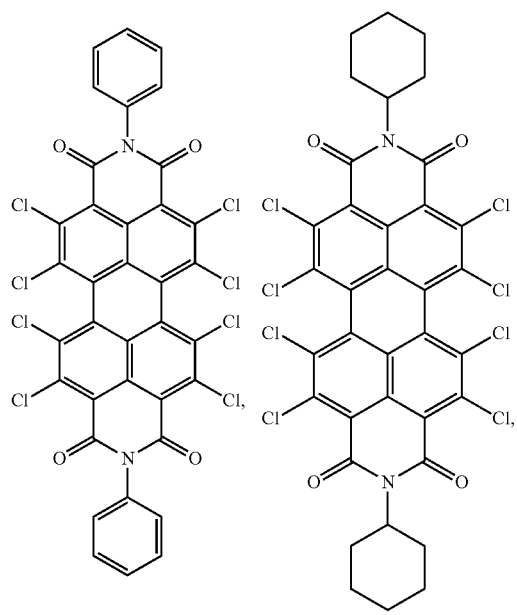
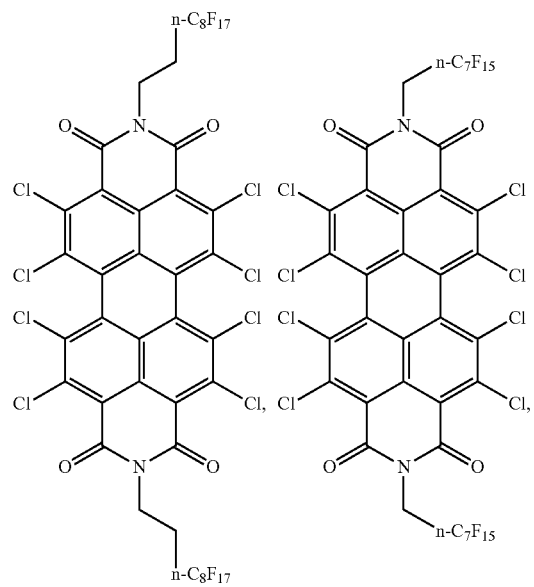
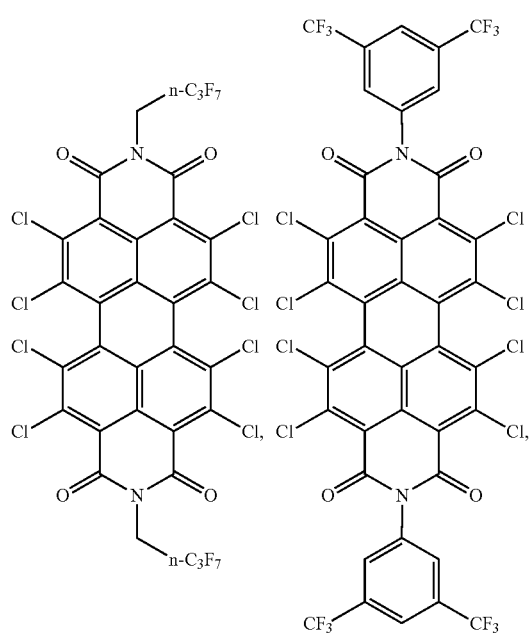
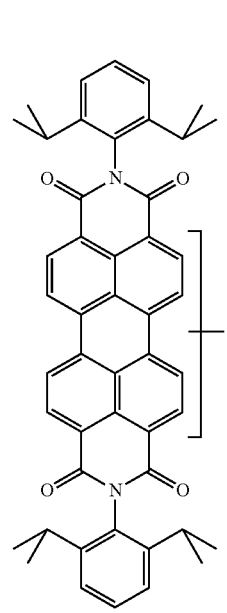
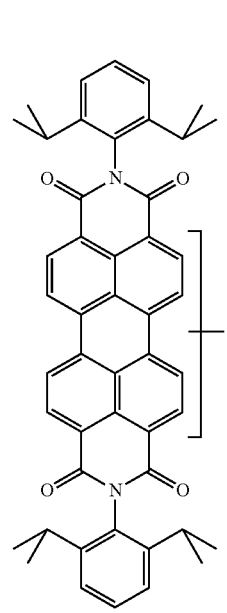

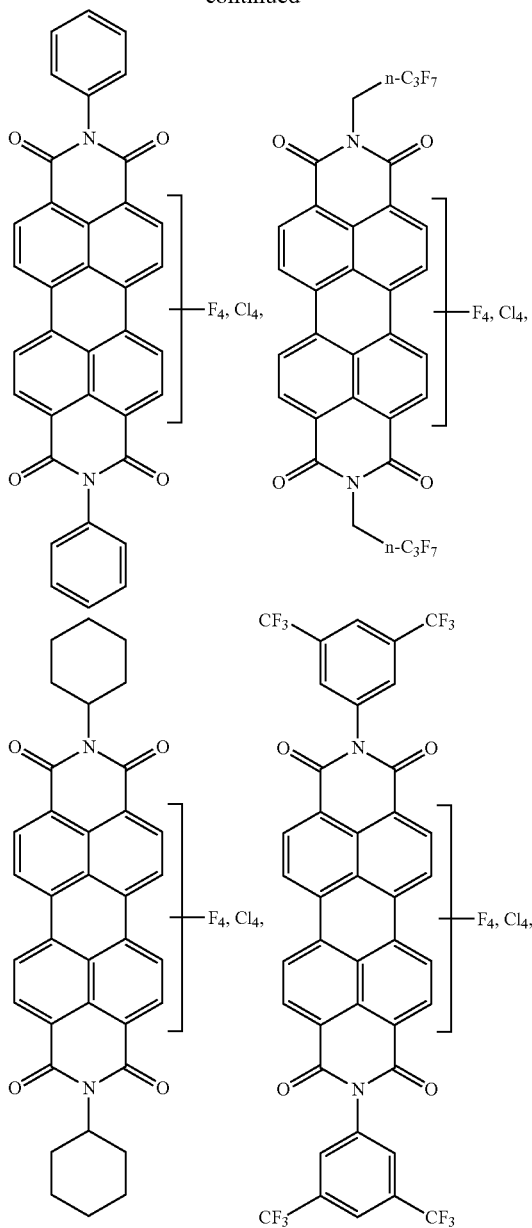

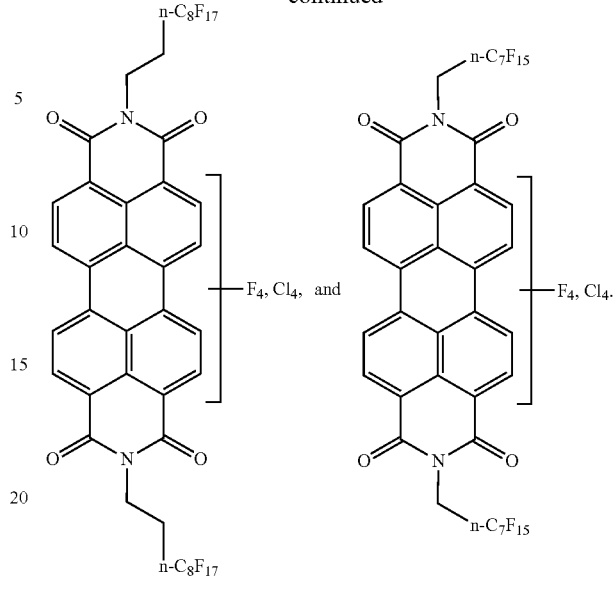

9. The method according to claim 1, wherein each of $R^a$ and $R^b$ represents a 2,2,3,3,3-pentafluoropropyl group; a 2,2-difluoroethyl group; a 2,2,3,3,4,4,4-heptafluorobutyl group; a 2,2,3,3,3-pentafluoropropyl group; a 1H,1H-pentadecafluorooctyl group; a 3-bromo-3,3-difluoropropyl group; a 3,3,3-trifluoropropyl group; a 1H,1H,2H,2H-perfluorodecyl group; a 3-(perfluorooctyl)propyl group; a 4,4-difluorobutyl; a 4,4,4-trifluorobutyl group; a 5,5,6,6,6-pentafluorohexyl group; a 2,2-difluoropropyl group; a 2,2,2-trifluoroethyl group; or a 2-bromo-2,2-difluoroethyl group.

\* \* \* \* \*

UNITED STATES PATENT AND TRADEMARK OFFICE
CERTIFICATE OF CORRECTION

Page 1 of 1

PATENT NO. : 8,674,104 B2
APPLICATION NO. : 13/734460
DATED : March 18, 2014
INVENTOR(S) : Martin Koenemann et al.

It is certified that error appears in the above-identified patent and that said Letters Patent is hereby corrected as shown below:

On the title page, Item (62), the Related U.S. Application Data Information is incorrect.
Item (62) should read:

--Related U.S. Application Data

(62) Division of application No. 12/673,908, filed on Feb. 17, 2010, now abandoned, which is a 371 of PCT/EP2008/060633, filed on Aug 13, 2008.--

Signed and Sealed this
Twelfth Day of August, 2014

Michelle K. Lee
*Deputy Director of the United States Patent and Trademark Office*